United States Patent
Sirohey et al.

(10) Patent No.: US 7,474,795 B2
(45) Date of Patent: *Jan. 6, 2009

(54) METHOD AND APPARATUS FOR TRANSMISSION AND DISPLAY OF A COMPRESSED DIGITALIZED IMAGE

(75) Inventors: Saad A. Sirohey, Pewaukee, WI (US); Robert D. Barnes, Palatine, IL (US); Joseph M. Carroll, Arlington Heights, IL (US)

(73) Assignee: GE Medical Systems Information Technologies, Inc., Milwaukee, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/807,399

(22) Filed: May 29, 2007

(65) Prior Publication Data

US 2007/0230829 A1    Oct. 4, 2007

Related U.S. Application Data

(63) Continuation of application No. 09/996,320, filed on Nov. 21, 2001, now Pat. No. 7,236,637, which is a continuation-in-part of application No. 09/716,603, filed on Nov. 20, 2000, now Pat. No. 6,912,319, which is a continuation-in-part of application No. 09/448,950, filed on Nov. 24, 1999, now Pat. No. 6,633,674.

(51) Int. Cl.
*G06K 9/36* (2006.01)
*G06K 9/32* (2006.01)
(52) U.S. Cl. ............................ 382/240; 382/299
(58) Field of Classification Search ............. 382/240, 382/299
See application file for complete search history.

(56) References Cited

U.S. PATENT DOCUMENTS

| 5,710,835 | A | | 1/1998 | Bradley |
| 5,867,602 | A | | 2/1999 | Zandi et al. |
| 5,881,176 | A | | 3/1999 | Keith et al. |
| 6,041,135 | A | * | 3/2000 | Buytaert et al. ............. 382/132 |

(Continued)

FOREIGN PATENT DOCUMENTS

EP    0 971 544    1/2000

(Continued)

OTHER PUBLICATIONS

Bilgin, Ali et al.; "Efficient Lossless Coding of Medical Image Volumes Using Reversible Integer Wavelet Transforms," Proceedings DCC '98 (IEEE Data Compression Conference), 1998.

*Primary Examiner*—Wenpeng Chen
(74) *Attorney, Agent, or Firm*—Fletcher Yoder

(57) ABSTRACT

The present technique selectively handles image data, which is decomposed into a plurality of resolution levels. In one embodiment, an image resolution suitable for display in a desired viewport is selected via an iterative process including determining whether scaling of one of the different image resolutions of the plurality of different image resolutions by a predetermined scaling threshold would result in a scaled image resolution that is less than or equal to the resolution of the desired viewport. A portion of the plurality of data sets may be selectively requested for recomposition of the image at the image resolution. Additional systems, methods, and devices for handling image data are also disclosed.

29 Claims, 17 Drawing Sheets

U.S. PATENT DOCUMENTS

| | | |
|---|---|---|
| 6,091,777 A | 7/2000 | Guetz et al. |
| 6,157,746 A | 12/2000 | Sodagar et al. |
| 6,314,452 B1 | 11/2001 | Dekel et al. |
| 6,445,823 B1 | 9/2002 | Liang |
| 6,545,687 B2 * | 4/2003 | Scott et al. ............ 345/629 |
| 6,553,141 B1 | 4/2003 | Huffman |
| 6,556,724 B1 | 4/2003 | Chang et al. |
| 6,574,629 B1 | 6/2003 | Cooke et al. |
| 6,633,674 B1 | 10/2003 | Barnes et al. |
| 6,711,297 B1 | 3/2004 | Chang et al. |
| 6,734,880 B2 | 5/2004 | Chang et al. |
| 6,760,489 B1 * | 7/2004 | Kuwata ................ 382/300 |
| 6,763,139 B1 | 7/2004 | Andrew |
| 6,792,151 B1 | 9/2004 | Barnes et al. |
| 6,795,583 B1 | 9/2004 | Barnes et al. |
| 6,912,317 B1 | 6/2005 | Barnes et al. |
| 6,912,319 B1 | 6/2005 | Barnes et al. |
| 6,925,208 B1 | 8/2005 | Huffman |
| 6,938,211 B1 | 8/2005 | Chang et al. |
| 7,006,696 B2 | 2/2006 | Huffman |
| 7,024,046 B2 | 4/2006 | Dekel et al. |
| 7,050,639 B1 | 5/2006 | Barnes et al. |
| 7,236,637 B2 * | 6/2007 | Sirohey et al. ............ 382/240 |
| 2002/0003906 A1 | 1/2002 | Zeng et al. |
| 2002/0044696 A1 | 4/2002 | Sirohey et al. |
| 2002/0057844 A1 | 5/2002 | Sirohey et al. |
| 2003/0005140 A1 | 1/2003 | Dekel et al. |
| 2003/0059096 A1 | 3/2003 | Dekel et al. |
| 2004/0179744 A1 | 9/2004 | Chang et al. |
| 2005/0271283 A1 | 12/2005 | Dekel et al. |

FOREIGN PATENT DOCUMENTS

| | | |
|---|---|---|
| WO | WO 96/29818 | 9/1996 |
| WO | WO 99/53429 | 10/1999 |

* cited by examiner

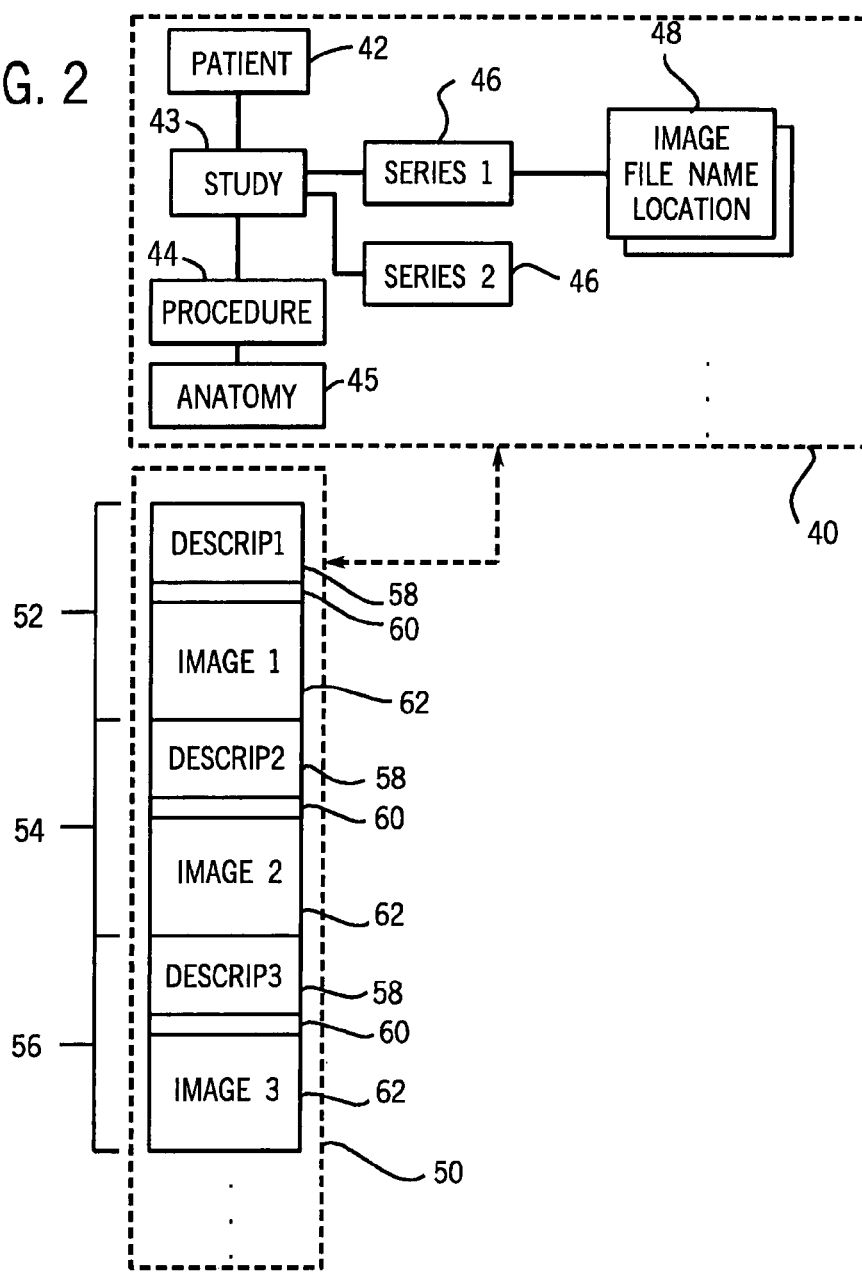
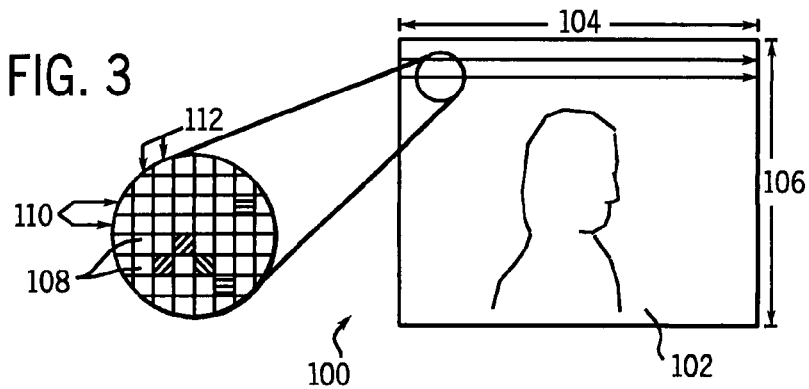

FIG. 7

16 – BIT LOSSLESS ENCODING
SCHEME 0 – MAX RATIO = 16:1

| HUFFMAN CODE PREFIX | CODE EXTENSION | DIFFERENCE d | CODE LENGTH | ENCODED RANGE WIDTH |
|---|---|---|---|---|
| 0 | | 0 | 1 | 0 |
| 100 | | +1 | 3 | +1 |
| 101 | | -1 | 3 | |
| 1100 | X | +2 TO +3 | 5 | +2 |
| 1101 | X | -2 TO -3 | 5 | |
| 11100 | XX | +4 TO +7 | 7 | +4 |
| 11101 | XX | -4 TO -7 | 7 | |
| 111100 | XXX | +8 TO +15 | 9 | +8 |
| 111101 | XXX | -8 TO -15 | 9 | |
| 1111100 | XXXX | +16 TO +31 | 11 | +16 |
| 1111101 | XXXX | -16 TO -31 | 11 | |
| 11111100 | XXXXX | +32 TO +63 | 13 | +32 |
| 11111101 | XXXXX | -32 TO -61 | 13 | |
| 111111100 | XXXXXX | +64 TO +127 | 15 | +64 |
| 111111101 | XXXXXX | -64 TO -127 | 15 | |
| 1111111100 | XXXXXXX | +128 TO +255 | 17 | +128 |
| 1111111101 | XXXXXXX | -128 TO -255 | 17 | |
| 11111111100 | XXXXXXXX | +256 TO +511 | 19 | +256 |
| 11111111101 | XXXXXXXX | -256 TO -511 | 19 | |
| 11111111110 (<16 BITS) | | ACTUAL VALUE | 27 | |
| 11111111111 | | END OF BLOCK | 11 | |

FIG. 8

SCHEME 1 – MAX RATIO = 5.33:1

| HUFFMAN CODE PREFIX | CODE EXTENSION | DIFFERENCE d | CODE LENGTH | ENCODED RANGE WIDTH |
|---|---|---|---|---|
| 00 | X | 0 TO +1 | 3 | 1 |
| 01 | X | -1 TO -2 | 3 | |
| 100 | XX | +2 TO +5 | 5 | +4 |
| 101 | XX | -3 TO -6 | 5 | |
| 1100 | XXX | +6 TO +13 | 7 | +8 |
| 1101 | XXX | -7 TO -14 | 7 | |
| 11100 | XXXX | +14 TO +29 | 9 | +16 |
| 11101 | XXXX | -15 TO -30 | 9 | |
| 111100 | XXXXX | +30 TO +61 | 11 | +32 |
| 111101 | XXXXX | -31 TO -62 | 11 | |
| 1111100 | XXXXXX | +62 TO +125 | 13 | +64 |
| 1111101 | XXXXXX | -63 TO -126 | 13 | |
| 11111100 | XXXXXXX | +126 TO +253 | 15 | +128 |
| 11111101 | XXXXXXX | -127 TO -254 | 15 | |
| 111111100 | XXXXXXXX | +254 TO +509 | 17 | +256 |
| 111111101 | XXXXXXXX | -255 TO -510 | 17 | |
| 1111111100 | XXXXXXXXX | +510 TO +1021 | 19 | +512 |
| 1111111101 | XXXXXXXXX | -511 TO -1022 | 19 | |
| 1111111110 (<16 BITS) | | ACTUAL VALUE | 26 | |
| 1111111111 | | END OF BLOCK | 10 | |

FIG. 9

SCHEME 2 — MAX RATIO = 4:1

| HUFFMAN CODE PREFIX | CODE EXTENSION | DIFFERENCE d | CODE LENGTH | ENCODED RANGE WIDTH |
|---|---|---|---|---|
| 00 | XX | 0 TO +3 | 4 | 3 ←—186 |
| 01 | XX | −1 TO −4 | 4 | |
| 100 | XXX | +4 TO +11 | 6 | +8 |
| 101 | XXX | −5 TO −12 | 6 | |
| 1100 | XXXX | +12 TO +27 | 8 | +16 |
| 1101 | XXXX | −13 TO −28 | 8 | |
| 11100 | XXXXX | +28 TO +59 | 10 | +32 |
| 11101 | XXXXX | −29 TO −60 | 10 | |
| 111100 | XXXXXX | +60 TO +123 | 12 | +64 |
| 111101 | XXXXXX | −61 TO −124 | 12 | |
| 1111100 | XXXXXXX | +124 TO +251 | 14 | +128 |
| 1111101 | XXXXXXX | −125 TO −252 | 14 | |
| 11111100 | XXXXXXXX | +252 TO +507 | 16 | +256 |
| 11111101 | XXXXXXXX | −253 TO −508 | 16 | |
| 111111100 | XXXXXXXXX | +508 TO +1019 | 18 | +512 |
| 111111101 | XXXXXXXXX | −509 TO −1020 | 18 | |
| 111111110 | <16 BITS) | ACTUAL VALUE | 25 | |
| 111111111 | | END OF BLOCK | 9 | |

FIG. 10

SCHEME 3 — MAX RATIO = 3.2:1

| HUFFMAN CODE PREFIX | CODE EXTENSION | DIFFERENCE d | CODE LENGTH | ENCODED RANGE WIDTH |
|---|---|---|---|---|
| 00 | XXX | 0 TO +7 | 5 | 7 ←—188 |
| 01 | XXX | −1 TO −8 | 5 | |
| 100 | XXXX | +8 TO +23 | 7 | +16 |
| 101 | XXXX | −9 TO −24 | 7 | |
| 1100 | XXXXX | +24 TO +55 | 9 | +32 |
| 1101 | XXXXX | −25 TO −56 | 9 | |
| 11100 | XXXXXX | +56 TO +119 | 11 | +64 |
| 11101 | XXXXXX | −57 TO −120 | 11 | |
| 111100 | XXXXXXX | +120 TO +247 | 13 | +128 |
| 111101 | XXXXXXX | −121 TO −248 | 13 | |
| 1111100 | XXXXXXXX | +248 TO +503 | 15 | +256 |
| 1111101 | XXXXXXXX | −249 TO −504 | 15 | |
| 11111100 | XXXXXXXXX | +504 TO +1015 | 17 | +512 |
| 11111101 | XXXXXXXXX | −505 TO −1016 | 17 | |
| 11111110 | <16 BITS) | ACTUAL VALUE | 24 | |
| 11111111 | | END OF BLOCK | 8 | |

FIG. 11

SCHEME 4 — MAX RATIO = 2.67:1

| HUFFMAN CODE PREFIX | CODE EXTENSION | DIFFERENCE d | CODE LENGTH | ENCODED RANGE WIDTH |
|---|---|---|---|---|
| 00 | XXXX | 0 TO +15 | 6 | 15 |
| 01 | XXXX | −1 TO −16 | 6 | |
| 100 | XXXXX | +16 TO +47 | 8 | +32 |
| 101 | XXXXX | −17 TO −48 | 8 | |
| 1100 | XXXXXX | +48 TO +111 | 10 | +64 |
| 1101 | XXXXXX | −49 TO −112 | 10 | |
| 11100 | XXXXXXX | +112 TO +239 | 12 | +128 |
| 11101 | XXXXXXX | −113 TO −240 | 12 | |
| 111100 | XXXXXXXX | +240 TO +495 | 14 | +256 |
| 111101 | XXXXXXXX | −241 TO −496 | 14 | |
| 1111100 | XXXXXXXXX | +496 TO +1007 | 16 | +512 |
| 1111101 | XXXXXXXXX | −497 TO −1008 | 16 | |
| 1111110 | <16 BITS) | ACTUAL VALUE | 23 | |
| 1111111 | | END OF BLOCK | 7 | |

SCHEME 5 — MAX RATIO = 2.29:1

| HUFFMAN CODE PREFIX | CODE EXTENSION | DIFFERENCE d | CODE LENGTH | ENCODED RANGE WIDTH |
|---|---|---|---|---|
| 00 | XXXXX | 0 TO +31 | 7 | 31 |
| 01 | XXXXX | −1 TO −32 | 7 | |
| 100 | XXXXXX | +32 TO +95 | 9 | +64 |
| 101 | XXXXXX | −33 TO −96 | 9 | |
| 1100 | XXXXXXX | +96 TO +223 | 11 | +128 |
| 1101 | XXXXXXX | −97 TO −224 | 11 | |
| 11100 | XXXXXXXX | +224 TO +479 | 13 | +256 |
| 11101 | XXXXXXXX | −225 TO −480 | 13 | |
| 111100 | XXXXXXXX | +480 TO +991 | 15 | +512 |
| 111101 | XXXXXXXX | −481 TO −992 | 15 | |
| 111110 | <16 BITS) | ACTUAL VALUE | 22 | |
| 111111 | | END OF BLOCK | 6 | |

192

FIG. 14
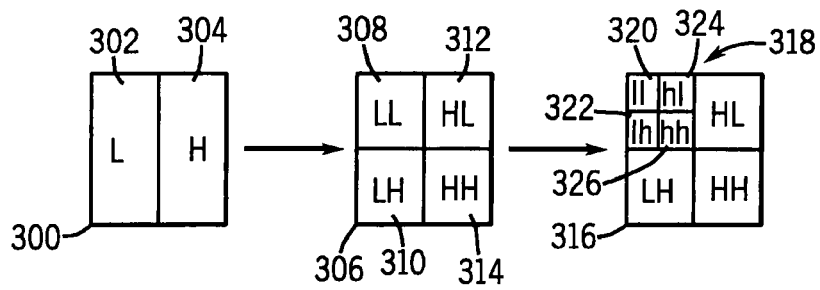
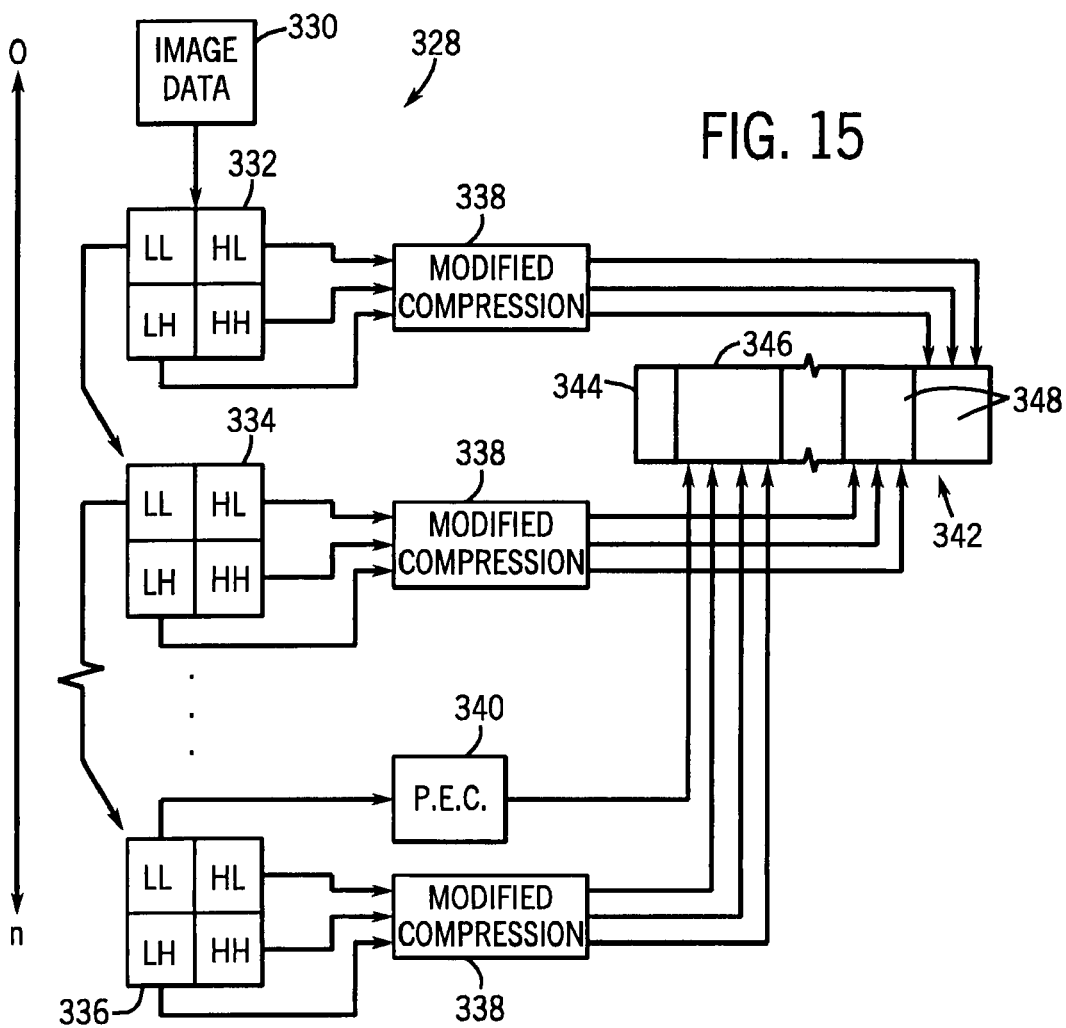
FIG. 15

FIG. 18
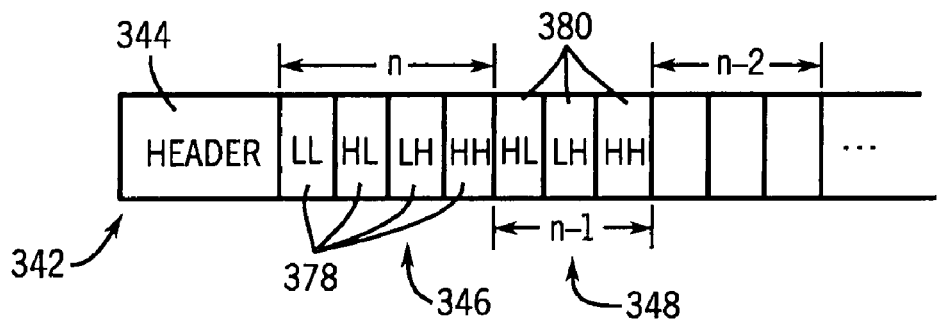
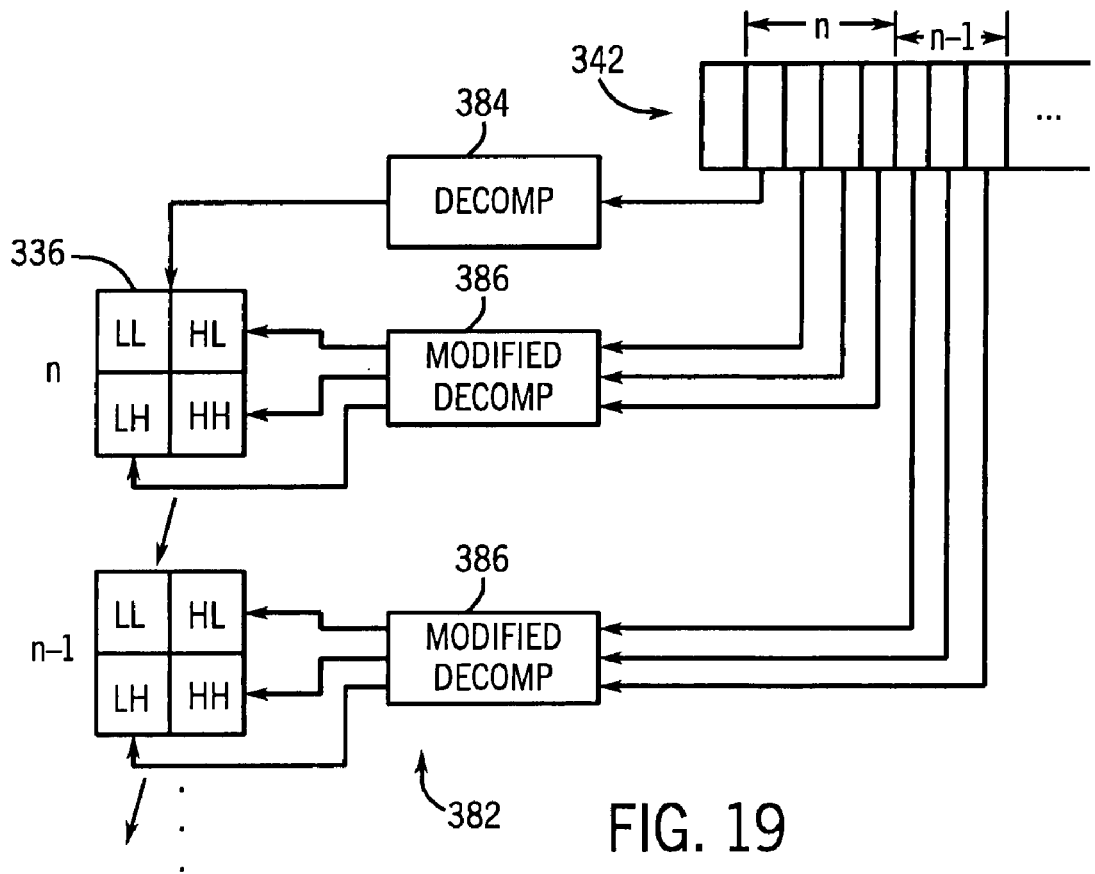
FIG. 19

FIG. 20

| LEVEL | ROWS | COLS | COMPRESSED BYTES | EFF COMP RATIO |
|---|---|---|---|---|
| 5 | 64 | 79 | 5652 | 1811:1 |
| 4 | 128 | 157 | 13780 | 526:1 |
| 3 | 256 | 313 | 49868 | 147:1 |
| 2 | 512 | 625 | 186128 | 40:1 |
| 1 | 1024 | 1250 | 724560 | 10:1 |
| 0 | 2048 | 2500 | 2929860 | 2.6:1 |

388

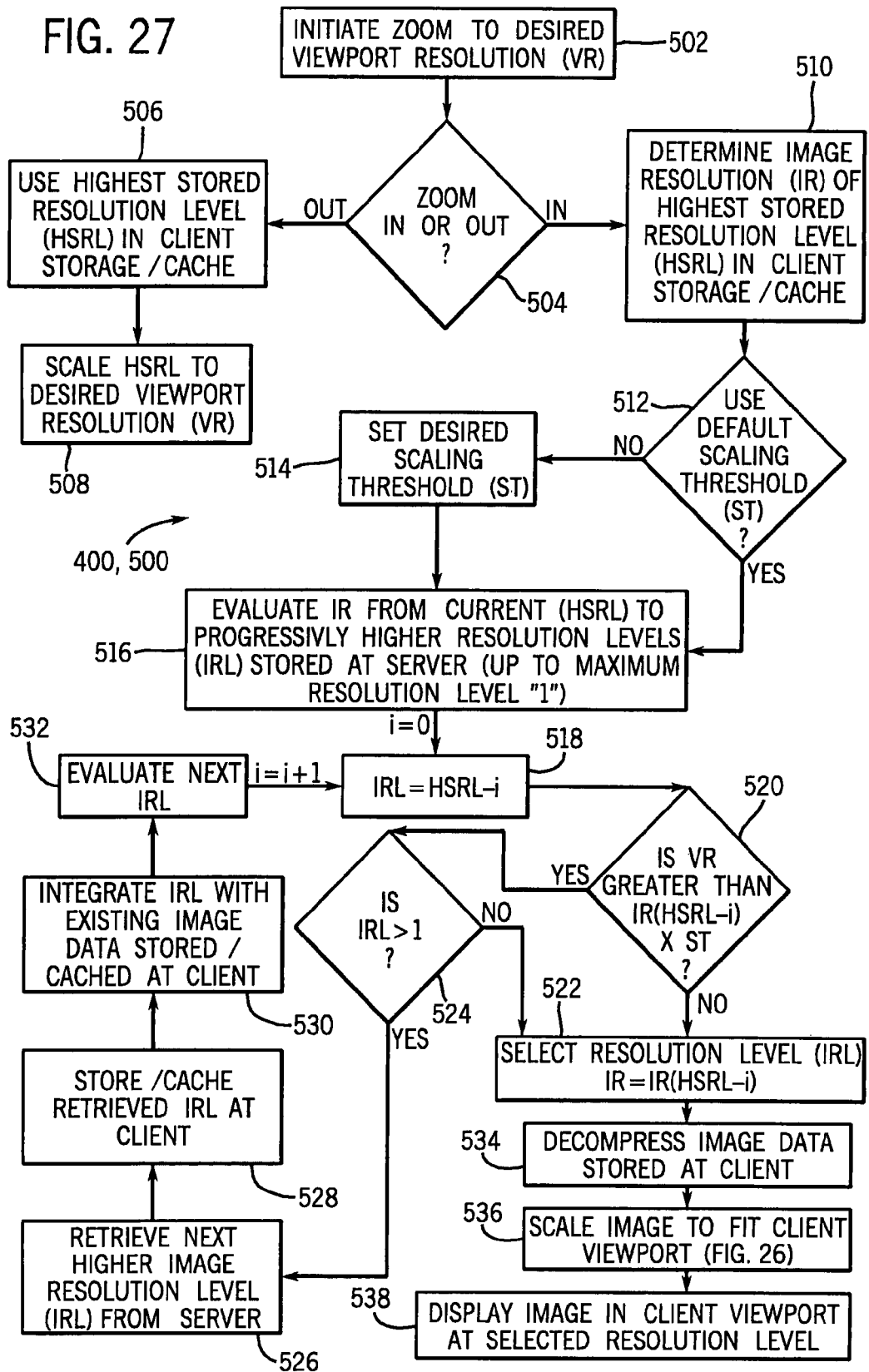

METHOD AND APPARATUS FOR TRANSMISSION AND DISPLAY OF A COMPRESSED DIGITALIZED IMAGE

CROSS-REFERENCE TO RELATED APPLICATIONS

The present is a Continuation of U.S. patent application Ser. No. 09/996,320, filed Nov. 21, 2001, and issued as U.S. Pat. No. 7,236,637 on Jun. 26, 2007, which is a Continuation-in-Part of U.S. patent application Ser. No. 09/716,603, filed Nov. 20, 2000, and issued as U.S. Pat. No. 6,912,319 on Jun. 28, 2005, which is a Continuation-In-Part of U.S. patent application Ser. No. 09/448,950, filed on Nov. 24, 1999, and issued as U.S. Pat. No. 6,633,674 on Oct. 14, 2003.

FIELD OF THE INVENTION

The present invention relates generally to the field of image data compression. More particularly, the invention relates to a technique for handling image data for rapid transmission and adaptation to a desired viewport.

BACKGROUND OF THE INVENTION

A wide range of applications exist for image data compression. Digitized images may be created in a variety of manners, such as via relatively simple digitizing equipment and digital camera, as well as by complex imaging systems, such as those used in medical diagnostic applications. Regardless of the environment in which the image data originates, the digital data descriptive of the images is stored for later reconstruction and display, and may be transmitted to various locations by networks, such as the Internet. Goals in digital image management include the efficient use of memory allocated for storage of the image data, as well as the efficient and rapid transmission of the image data for reconstruction. The latter goal is particularly important where large or complex images are to be handled over comparatively limited bandwidth networks. In the medical diagnostic imaging field, for example, very large image data sets may be available for transmission and viewing by a range of users, including those having limited access to very high bandwidths needed for rapid transmission of full detail images.

Picture archiving and communication systems, or PACS, have become an extremely important component in the management of digitized image data, particularly in the field of medical imaging. Such systems often function as central repositories of image data, receiving the data from various sources, such as medical imaging systems. The image data is stored and made available to radiologists, diagnosing and referring physicians, and other specialists via network links. Improvements in PACS have led to dramatic advances in the volumes of image data available, and have facilitated loading and transferring of voluminous data files both within institutions and between the central storage location or locations and remote clients.

A major challenge to further improvements in all image handling systems, from simple Internet browsers to PACS in medical diagnostic applications, is the handling of the large data files defining images. In the medical diagnostics field, depending upon the imaging modality, digitized data may be acquired and processed for a substantial number of images in a single examination, each image representing a large data set defining discrete picture elements or pixels of a reconstructed image. Computed Tomography (CT) imaging systems, for example, can produce numerous separate images along an anatomy of interest in a very short examination timeframe. Ideally, all such images are stored centrally on the PACS, and made available to the radiologist for review and diagnosis.

Various techniques have been proposed and are currently in use for analyzing and compressing large data files, such as medical image data files. Image data files typically include streams of data descriptive of image characteristics, typically of intensities or other characteristics of individual pixels in the reconstructed image. In the medical diagnostic field, these image files are typically created during an image acquisition or encoding sequence, such as in an x-ray system, a magnetic resonance imaging system, a computed tomography imaging system, and so forth. The image data is then processed, such as to adjust dynamic ranges, or to enhance certain features shown in the image, for storage, transmittal and display.

While image files may be stored in raw and processed formats, many image files are quite large, and would occupy considerable disc or storage space. The increasing complexity of imaging systems also has led to the creation of very large image files, typically including more data as a result of the useful dynamic range of the imaging system, the size of the matrix of image pixels, and the number of images acquired per examination.

In addition to occupying large segments of available memory, large image files can be difficult or time consuming to transmit from one location to another. In a typical medical imaging application, for example, a scanner or other imaging device will typically create raw data that may be at least partially processed at the scanner. The data is then transmitted to other image processing circuitry, typically including a programmed computer, where the image data is further processed and enhanced. Ultimately, the image data is stored either locally at the system, or in the PACS for later retrieval and analysis. In all of these data transmission steps, the large image data file must be accessed and transmitted from one device to another.

Current image handling techniques include compression of image data within the PACS environment to reduce the storage requirements and transmission times. Such compression techniques may, however, compress entire files, including descriptive header information that could be useful in accessing or correlating images for review. Moreover, current techniques do not offer sufficiently rapid compression and decompression of image files to satisfy increasing demands on system throughput rates and access times. Finally, alternative compression and decompression techniques do not offer the desired compression ratios, in combination with rapid compression and decompression in a client-server environment.

Another drawback of existing compression techniques is the storage, access and transmission of large data files even when a user cannot or does not desire to view the reconstructed image in all available detail. For example, in medical imaging, extremely detailed images may be acquired and stored, while a radiologist or physician who desires to view the images may not have a view port capable of displaying the image in the resolution in which they are stored. Thus, transmission of the entire images to a remote viewing station, in relatively time consuming operations, may not provide any real benefit and may slow reading or other use of the images.

There is a need, therefore, for an improved image data handling technique that provides for rapid transmission of image files and selective handling based on resolution characteristics of a desired viewport.

SUMMARY OF THE INVENTION

The present technique selectively handles image data, which is decomposed into a plurality of resolution levels. The image data may be retrieved in order of progressively higher resolution levels for display in a viewport, which may have a viewport resolution that is higher or lower than a desired one of the resolution levels. Initially, the image data may be displayed in the viewport at a relatively lower one of the plurality of resolution levels. As a user desires higher resolution displays of all or part of the image, one or more of the progressively higher resolution levels may be retrieved and scaled to fit the viewport. Accordingly, the present technique handles the data more efficiently by accessing the image data in blocks corresponding to the plurality of resolution levels, rather than accessing the entirety of the image data. A scaling threshold also can be used to signal the need for a next higher level of the plurality of resolution levels.

BRIEF DESCRIPTION OF THE DRAWINGS

The foregoing and other advantages and features of the invention will become apparent upon reading the following detailed description and upon reference to the drawings in which:

FIG. 2 is a diagrammatical representation of contents of a database for referencing stored image data in files containing multiple image data sets, compressed data, and descriptive information;

FIG. 3 is a representation of a typical image of the type received, compressed, and stored on the system of FIG. 1;

FIGS. 7, 8, 9, 10, 11 and 12 are exemplary lookup tables in the form of compression code tables used to optimally compress subregions of image data in accordance with the present technique during the process illustrated in FIG. 6;

FIG. 14 is a process map illustrating progressive wavelet decomposition of image data in accordance with a further aspect of the present technique, permitting generation of a multiresolution compressed image data set;

FIG. 15 is a process map illustrating the progressive wavelet decomposition of FIG. 14 in conjunction with compression of the resulting data for compression of generation of the multiresolution compressed image data set;

FIG. 18 is a diagrammatical representation of an exemplary image data set including a header and blocks of compressed data in multiresolution compression;

FIG. 19 is a process map illustrating image data decompression and inverse wavelet transformation to obtain images of desired resolution;

FIG. 20 is a table indicating exemplary compression levels obtained via the present technique;

FIG. 27 is a flow chart illustrating an exemplary continuous data retrieval and display process for the image transmission system illustrated in FIG. 21.

DETAILED DESCRIPTION OF SPECIFIC EMBODIMENTS

Figure 1:
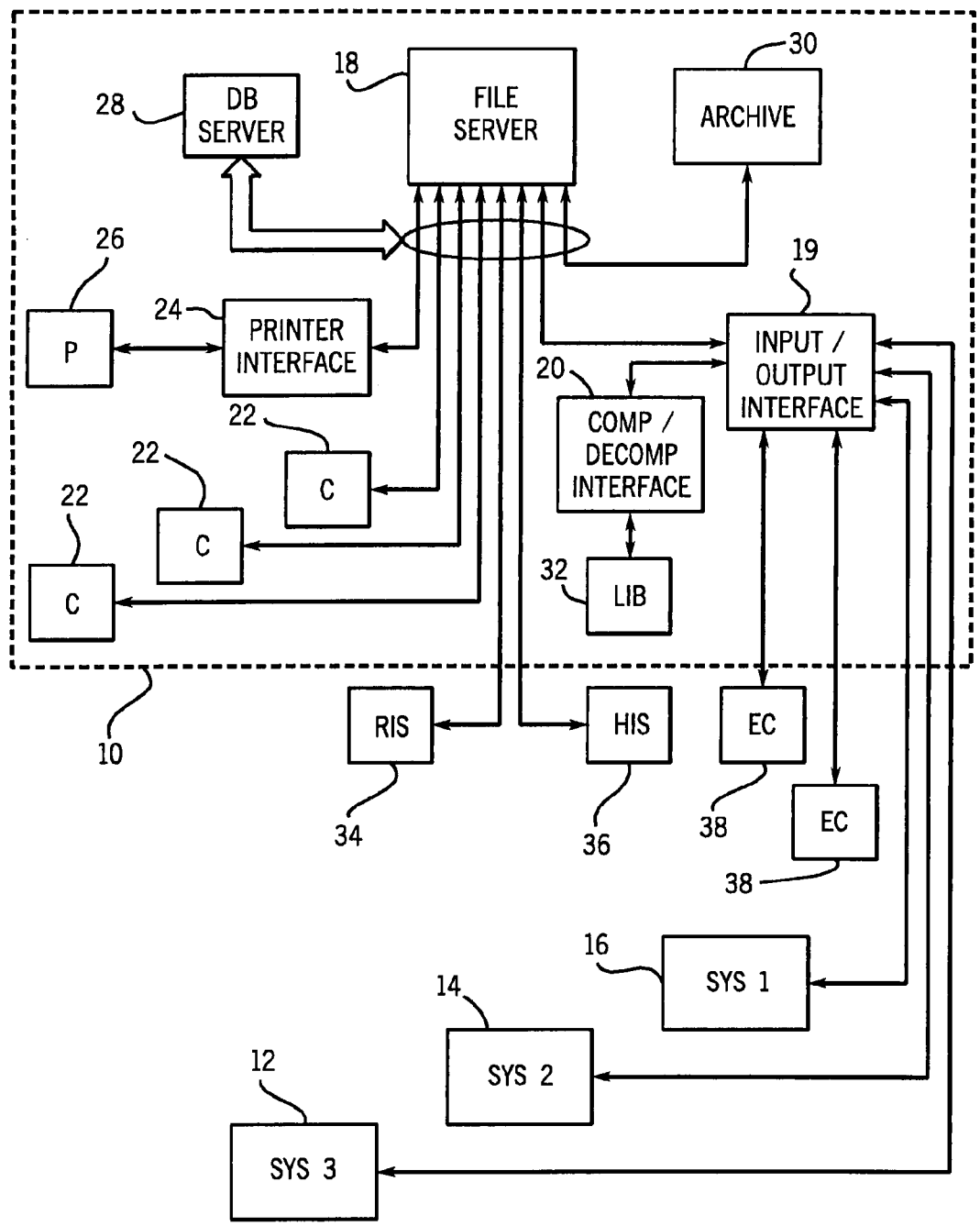
FIG. 1 is a diagrammatical representation of an exemplary image management system, in the illustrated example a picture archiving and communication system or PACS, for receiving and storing image data in accordance with certain aspects of the present technique.

FIG. 1 illustrates an exemplary image data management system in the form of a picture archive and communication system or PACS 10 for receiving, compressing and decompressing image data. In the illustrated embodiment, PACS 10 receives image data from several separate imaging systems designated by reference numerals 12, 14 and 16. As will be appreciated by those skilled in the art, the imaging systems may be of various type and modality, such as magnetic resonance imaging (MRI) systems, computed tomography (CT) systems, positron emission tomography (PET) systems, radio fluoroscopy (RF), computed radiography (CR), ultrasound systems, and so forth. Moreover, the systems may include processing stations or digitizing stations, such as equipment designed to provide digitized image data based upon existing film or hard copy images. It should also be noted that the systems supplying the image data to the PACS may be located locally with respect to the PACS, such as in the same institution or facility, or may be entirely remote from the PACS, such as in an outlying clinic or affiliated institution. In the latter case, the image data may be transmitted via any suitable network link, including open networks, proprietary networks, virtual private networks, and so forth.

PACS 10 includes one or more file servers 18 designed to receive and process image data, and to make the image data available for decompression and review. Server 18 receives the image data through an input/output interface 19. Image data may be compressed in routines accessed through a compression/decompression interface 20. As described more fully below, interface 20 serves to compress the incoming image data rapidly and optimally, while maintaining descriptive image data available for reference by server 18 and other components of the PACS. Where desired, interface 20 may also serve to decompress image data accessed through the server. The server is also coupled to internal clients, as indicated at reference numeral 22, each client typically including a work station at which a radiologist, physician, or clinician may access image data from the server, decompress the image data, and view or output the image data as desired. Clients 22 may also input information, such as dictation of a radiologist following review of examination sequences. Similarly, server 18 may be coupled to one or more interfaces, such as a printer interface 24 designed to access and decompress image data, and to output hard copy images via a printer 26 or other peripheral.

Server 28 may associate image data, and other work flow information within the PACS by reference to one or more file servers 18. In the presently contemplated embodiment, database server 28 may include cross-referenced information regarding specific image sequences, referring or diagnosing physician information, patient information, background information, work list cross-references, and so forth. The information within database server 28 serves to facilitate storage and association of the image data files with one another, and to allow requesting clients to rapidly and accurately access image data files stored within the system. Similarly, server 18 is coupled to one or more archives 30, such as an optical storage system, which serve as repositories of large volumes of image data for backup and archiving purposes. Techniques for transferring image data between server 18, and any memory associated with server 18 forming a short term storage system, and archive 30, may follow any suitable data management scheme, such as to archive image data following review and dictation by a radiologist, or after a sufficient time has lapsed since the receipt or review of the image files.

In the illustrated embodiment, other components of the PACS system or institution may be integrated with the foregoing components to further enhance the system functionality. For example, as illustrated in FIG. 1, a compression/decompression library 32 is coupled to interface 20 and serves to store compression routines, algorithms, look up tables, and so forth, for access by interface 20 (or other system components) upon execution of compression and decompression routines (i.e. to store various routines, software versions, code tables, and so forth). In practice, interface 20 may be part of library 32. Library 32 may also be coupled to other components of the system, such as client stations 22 or printer interface 24, serving similarly as a library or store for the compression and decompression routines and algorithms. Although illustrated as a separate component in FIG. 1, it should be understood that library 32 may be included in any suitable server or memory device, including within server 18. Moreover, code defining the compression and decompression processes described below may be loaded directly into interface 20 and/or library 32, or may be loaded or updated via network links, including wide area networks, open networks, and so forth.

Additional systems may be linked to the PACS, such as directly to server 28, or through interfaces such as interface 19. In the embodiment illustrated in FIG. 1, a radiology department information system or RIS 34 is linked to server 18 to facilitate exchanges of data, typically cross-referencing data within database server 28, and a central or departmental information system or database. Similarly, a hospital information system or HIS 36 may be coupled to server 28 to similarly exchange database information, workflow information, and so forth. Where desired, such systems may be interfaced through data exchange software, or may be partially or fully integrated with the PACS system to provide access to data between the PACS database and radiology department or hospital databases, or to provide a single cross-referencing database. Similarly, external clients, as designated at reference numeral 38, may be interfaced with the PACS to enable images to be viewed at remote locations. Such external clients may employ decompression software, or may receive image files already decompressed by interface 20. Again, links to such external clients may be made through any suitable connection, such as wide area networks, virtual private networks, and so forth.

FIG. 2 illustrates in somewhat greater detail the type of cross-referencing data made available to clients 20, 22, 24, and 30 through database server 28. The database entries, designated generally by reference numeral 40 in FIG. 2, will include cross-referenced information, including patient data 42, references to specific studies or examinations 43, references to specific procedures performed 44, references to anatomy imaged 45, and further references to specific image series 46 within the study or examination. As will be appreciated by those skilled in the art, such cross-referenced information may include further information regarding the time and date of the examination and series, the name of diagnosing, referring, and other physicians, the hospital or department where the images are created, and so forth. The database will also include address information identifying specific images, file names, and locations of the images as indicated at reference numeral 48. Where the PACS includes various associated memory devices or short term storage systems, these locations may be cross-referenced within the database and may be essentially hidden from the end user, the image files simply being accessed by the system for viewing from the specific storage location based upon cross-referenced information in the database.

As described more fully below, in accordance with certain aspects of the present technique, descriptive information is used to identify preferred or optimal compression routines used to compress image data. Such descriptive information is typically available from header sections of an image data string, also as described in detail below. However, information available from database server 28 may also serve as the basis for certain of the selections of the algorithms employed in the compression technique. Specifically database references may be relied upon for identifying such descriptive information as the procedures performed in an imaging sequence, specific anatomies or other features viewable in reconstructed images based upon the data, and so forth. Such information may also be available from the RIS 34 and from the HIS 36.

FIG. 2 also illustrates an exemplary image file cross-referenced by the database entries. As shown in FIG. 2, image file 50 includes a plurality of image data sets 52, 54 and 56. In a typical image file, a large number of such image sets may be defined by a continuous data stream. Each data set may be compressed in accordance with specific compression algorithms, including the compression algorithms as described below.

Within each image data set, a descriptive header 58 is provided, along with a compression header 60. The headers 58 and 60 are followed by compressed image data 62. The descriptive header 58 of each data set preferably includes industry-standard or recognizable descriptive information, such as DICOM compliant descriptive data. As will be appreciated by those skilled in the art, such descriptive information will typically include an identification of the patient, image, date of the study or series, modality of the system creating the image data, as well as additional information regarding specific anatomies or features visible in the reconstructed images. As described more fully below, such descriptive header data is preferably employed in the present technique for identification of optimal compression algorithms or routines used to compress the data within the compressed image data section 62. Data referring to the specific algorithm or routine used to compress the image data is then stored within compression header 60 for later reference in decompressing the image data. As described below, additional data is stored within the compressed image data, cross-referencing the algorithms identified in compression header 60 for use in decompressing the image data. Specifically, in a presently preferred embodiment, the compression header 60 includes identification of the length of subregions of the compressed image data, as well as references to specific optimal algorithms, in the form of compression code tables used to compress the subregions optimally.

FIG. 3 illustrates a typical image that is encoded by packets of digitized data assembled in a continuous data stream, which may be compressed and decompressed in the present techniques. The image, designated generally by the reference numeral 100, will typically include features of interest 102, such as specific anatomical features. In medical diagnostic applications, such features may include specific anatomies or regions of a patient viewable by virtue of the physics of the image acquisition modality, such as soft tissue in MRI system images, bone in x-ray images, and so forth. Each image is comprised of a matrix having a width 104 and a height 106 defined by the number and distribution of individual pixels 108. The pixels of the image matrix are arranged in rows 110 and columns 112, and will have varying characteristics which, when viewed in the reconstructed image, define the features of interest. In a typical medical diagnostic application, these characteristics will include gray level intensity or color. In the digitized data stream, each pixel is represented by binary code, with the binary code being appended to the descriptive header to aid in identification of the image and in its association with other images of a study. As noted above, such descriptive information may include industry standard information, such as DICOM compliant data.

Figure 4:
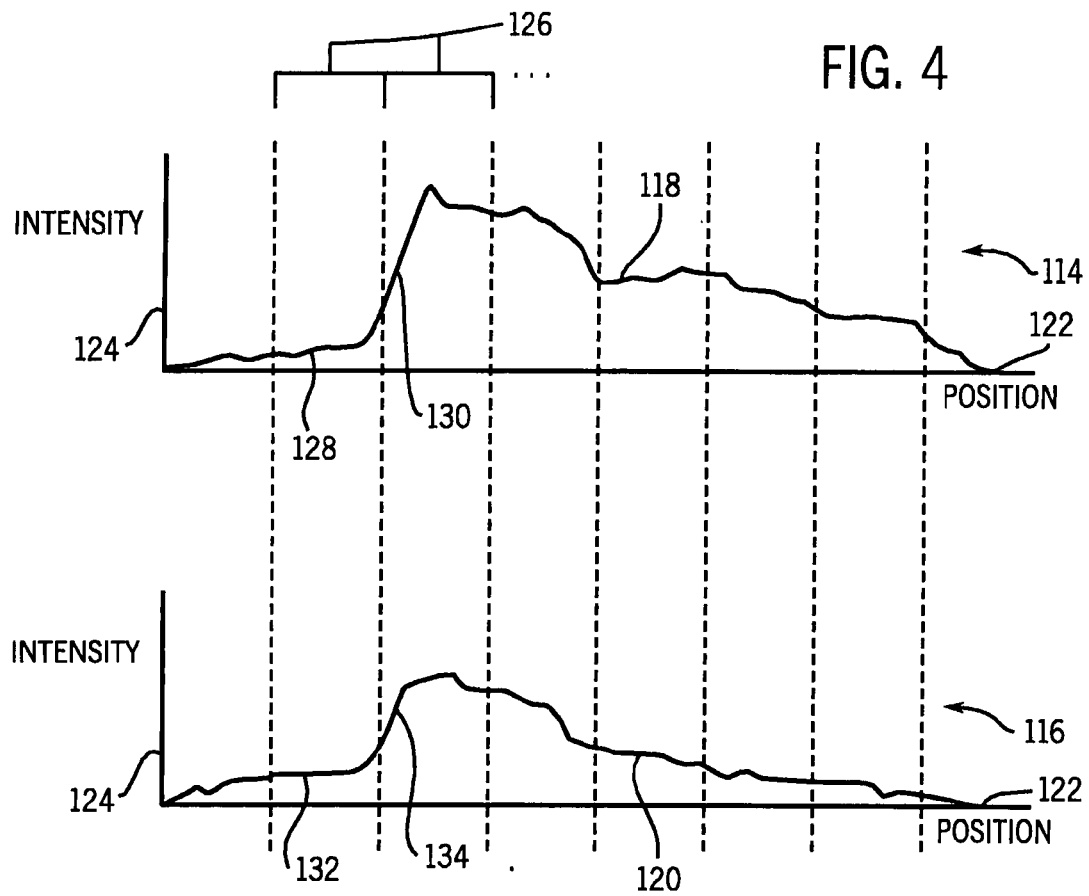
FIG. 4 is a graphical representation of intensities of pixelated data across an image, subdivided into subregions for compression of the subregions optimally based upon characteristics of the subregions.

FIG. 4 graphically represents intensities of pixel data defining an image across a pair of rows of the image matrix. Each row of the image matrix will include a series of pixels, each pixel being encoded by binary data descriptive of the pixel characteristics, typically intensity. Thus, lighter regions of the reconstructed image will correspond to pixels having a higher intensity level, with darker regions having a lower intensity level. When illustrated graphically, the intensity levels of the pixels across the image may form a contour or trace as shown in FIG. 4. Specifically, FIG. 4 illustrates a first row 114 lying adjacent to a second row 116, each row including a series of pixels having various intensities as indicated by traces 118 and 120, respectively. As will be appreciated by those skilled in the art, in practice, the graph of the pixel intensities would form a step-wise function along the position axis 122 and having amplitudes varying along the intensity axis 124.

It may be noted from FIG. 4 that in an actual image, variations in intensity along rows, and along columns as represented by correspondingly located intensities moving downwardly or upwardly through adjacent rows, will vary in accordance with the features represented in the reconstructed image. As illustrated in FIG. 4, row 114 includes areas of rising and declining intensity, including areas of both low intensity and high intensity. Row 116 includes areas of similar intensity, but varying by virtue of the features represented in the image. In accordance with the present technique, the image data stream is reduced to subregions as represented generally by reference numeral 126 in FIG. 4. While the subregions may be of different lengths (i.e. numbers of pixels), in the presently preferred embodiment, each subregion includes data encoding an equal number of pixels. Those skilled in the art will readily recognize, however, that after compression the actual length of codes for the subregion will vary depending upon the intensity of the pixels within the subregion and the dynamic range of the digital data encoding the pixel intensities. It should also be noted that where the row length of the image matrix is an integer multiple of the subregion width, individual subregions will align with one another moving down the image matrix as represented in FIG. 4. In general, however, the present technique is not limited to such integer multiple row widths.

Each subregion of the image data stream may be analyzed to identify entropy levels of the image data for compression purposes. In general, the entropy of the image data refers to the relative variation in the pixel intensities within each subregion. Thus, although a specific subregion may include pixels of a high intensity or a low intensity, where the intensity level is relatively stable or constant in the subregion, entropy is considered to be low. Such regions are shown in FIG. 4, for example, in portions of traces 114 and 116 indicated by reference numerals 128 and 132, respectively. On the contrary, where substantial variations in pixel intensity are encoded by the subregion data, the entropy level is considered high. Such regions are shown in FIG. 4 at reference numerals 130 and 134. It has been found that by subdividing the image data stream into subregions, which may have various lengths depending upon the image characteristics, and by analyzing the relative entropy level of each subregion, the subregions may be optimally compressed in accordance with one of several candidate compression algorithms. Specifically, the present technique employs a series of predefined compression code tables, which serve to translate pixel prediction errors into compressed codes for each subregion. The specific compression code table selected for each subregion is a function of the entropy identified for the subregion in the compression routine.

Figure 5:
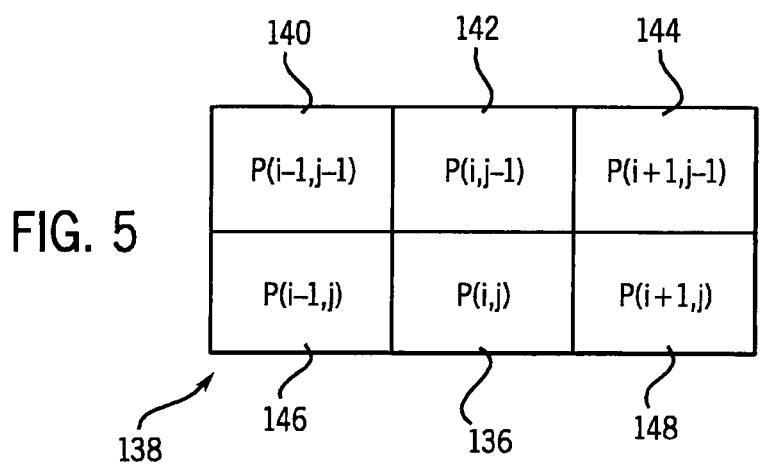
FIG. 5 is a diagrammatical representation of a pixel neighborhood used in the analysis of the image data for compression purposes.

As will be described more fully below, the present technique preferably employs pixel value predictors and identifies differences between predicted values of individual pixels (i.e. binary code for the pixel intensity or other characteristic) and the actual value for the respective pixels. In fact, several predictor algorithms may be employed, with the specific predictor being identified based upon image characteristics, such as characteristics encoded in a descriptive header for the image data stream. The predictors are based upon comparisons of target pixels, or pixels of interest, with neighboring pixels. FIG. 5 represents a pixel neighborhood that serves as the basis for references made in the predictor algorithms. The pixel neighborhood, identified by reference numeral 138 in FIG. 5, includes the pixel of interest 136, designated p(i, j). Neighboring pixels include a "northwest" pixel 140, designated p(i−1, j−1), a "north" pixel 142 designated p(i, j−1), a "northeast" pixel 144 designated p(i+1, j−1), and a "west" pixel 146 designated p(i−1, j). Some or all of these pixels may be employed in the predictor algorithm, or other additional pixels may be provided in a larger neighborhood.

Figure 6:
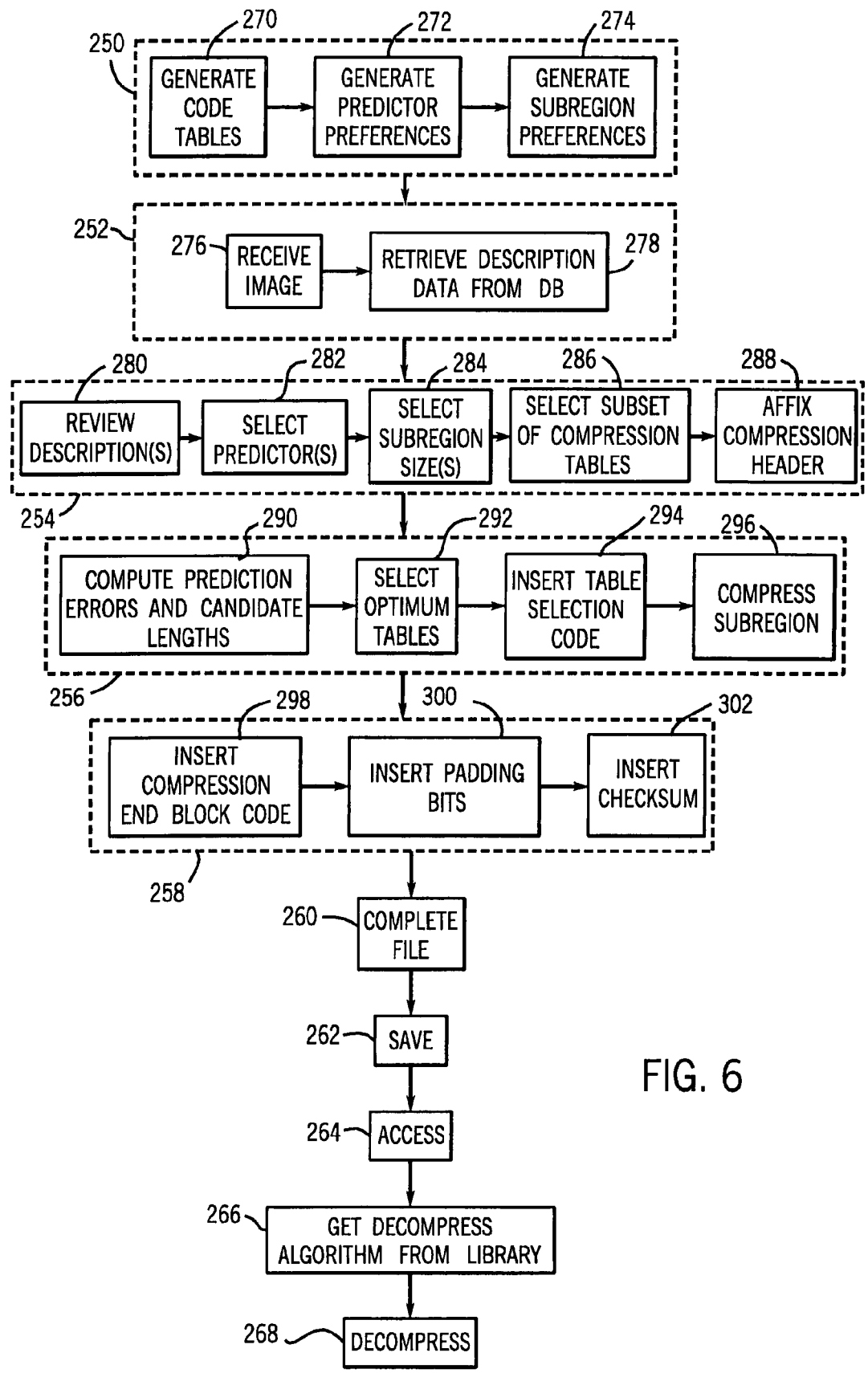
FIG. 6 is a flow chart illustrating exemplary control logic for compressing and decompressing image data in accordance with aspects of the present technique.

The preferred technique for compressing the image data stream in the system described above to create hybrid compressed image data files is summarized in FIG. 6. The control logic may be subdivided into a series of logical blocks or segments, including a configuration segment 250 in which optimal compression algorithms, tables, predictor preferences, block or subregion length preferences, and so forth, are established. In a data access and retrieval segment 252 the image data to be compressed is received, as is descriptive information from database server 28, if used. In an evaluation segment 254 the images are evaluated based upon the algorithms and preferences established in configuration segment 250. In a compression segment 256 certain values are computed and selected for the compression routine, and the image data is compressed to create the resulting compressed file. File code is added to the compressed data in a final segment 258. The file is then completed at step 260 and stored at step 262. The compression and decompression logic is then completed by eventual access of the compressed image file at step 264, retrieval of a decompression algorithm or algorithms at step 266 and decompression at step 268 for viewing and output. The foregoing logical segments and processes will be described below in greater detail.

The configuration segment 250 of the control logic includes steps of configuring the specific compression, predictor and block or subregion algorithms employed in the routine. Thus, at step 270 a series of compression code tables are generated for optimally compressing subregions of image data based upon relative entropy levels as indicated by prediction errors. As will be appreciated by those skilled in the art, such compression code tables serve to cross-reference original values with compressed values, generally in accordance with anticipated distributions or frequencies of occurrence of the original values. In the presently preferred embodiment, a series of compression code tables are established based upon analysis of typical images to be compressed by the routine. While the specific coding and ranges implemented in the compression code tables vary, and will generally be determined in specific applications empirically, examples of several such compression code tables are illustrated in FIGS. 7-12.

Referring to FIGS. 7-12, each compression code table, such as table 170 in FIG. 7, comprises a series of compressed data values 172 cross-referenced to original image parameters 174. In the example illustrated in the Figs., analysis may include an indication of the resulting code links in bits, as indicated by reference numeral 176, and the span of code translated by each table entry, as indicated by reference numeral 178. In the illustrated embodiment, the compressed data code of column 172 translates difference values of column 174 as identified by application of predictors in the compression routine, followed by determination of the differences between the predicted and actual values. Thus, by way of example, where a difference value of 1 is identified based upon a predictor algorithm as described below, table 170 provides a compressed data code of 100. Again, it should be noted that the difference value does not generally represent the value of the encoded pixel itself, but a difference between a predicted value and an actual value. Thus, in a code length of 3 bits, summarized in column 176 of table 170, the pixel of interest differing from the predicted value by 1 will obtain a compressed data value of 100, although the pixel value itself may be considerably longer. As also may be seen in FIG. 7, the compressed data codes provided in column 172 may be summarized as including a first portion 180 designating the level within the table, followed by a second portion 182 which indicates the position within the level or range. Thus, for example, in the case of the table of FIG. 7, a difference range of from −2 to −3 would be encoded as 1101 followed by an additional bit set to a value of 0 or 1 depending upon whether the difference is −2 or −3. At an upper limit of the range, the compressed data code is taken to be the actual value of the individual pixel as described below with reference to FIG. 13.

As can be seen from FIGS. 7-12, the compression code tables for translating prediction errors or differences to compressed code are established to provide a range of coding appropriate to the levels or variations in the difference values for each subregion of the data stream. Specifically, table 170 of FIG. 7 is adapted to a lowest entropy level as indicated by the low difference variation (zero) accommodated by the shortest code in the table and the relatively fine steps between the difference levels. FIG. 8 represents a second compression code table 184 providing for relatively higher entropy as indicated by the relatively broader maximum levels accommodated by the table and the relatively higher difference ranges as compared to table 170 of FIG. 7. FIGS. 9, 10, 11 and 12 provide additional examples of compression code tables 186, 188, 190 and 192, respectively, for encoding successively higher entropy levels as indicated by prediction errors or differences within the various subregions. In the present embodiment illustrated, the code tables are constructed using a Huffman code-based prefix and a multibit extension.

It should be noted that the compression ratio provided by each of the compression code tables in the family of tables varies depending upon the relative entropy level to be accommodated. Thus, table 170 of FIG. 7 provides a relatively high maximum compression ratio of 16:1, while table 192 of FIG. 12 provides a lower maximum compression ratio of 2.29:1. However, it has been found that the use of a plurality of different compression code tables to accommodate the different entropies of the data stream subregions results in excellent compression due to the use of compressed data code lengths optimally selected to accommodate the variations in prediction differences for the subregions.

It has been found that for specific types of images or for images having specific typical characteristics, various entropy levels may be anticipated. For example, in medical diagnostic imaging, relatively high entropy levels may be expected for specific modalities, such as CT and MRI data. Other imaging modalities may provide images with relatively lower variations in the image intensity levels, reflected by lower entropy values and correspondingly lower prediction differences. Moreover, it has been found that specific image types may provide higher or lower characteristic entropy values. In the medical diagnostics field, such image types may include specific anatomies, such as chest, head, extremities, and so forth, providing more or less variation, and stronger or weaker edge lines and contrast. The specific family of compression code tables, then, are preferably established based upon the typical images to be compressed by the system.

Returning to FIG. 6, with the family of compression code tables generated and stored at step 270, configuration segment 250 continues with generation of predictor preferences as indicated at step 272. As described above, rather than employ actual pixel intensity values for encoding in the present compression technique, difference values may be employed based upon the predictor algorithms. The predictor algorithms generally produce relatively low values in low entropy regions of the image, and relatively higher values in higher entropy regions. However, the use of prediction errors for the data compression will generally result in compression of values that are lower (i.e. shorter in length) than the original data stream code values due to the relatively gradual progression of intensity variations over the image.

In the presently preferred embodiment, one or more of several predictor algorithms may be employed. Referring again to FIG. 5, in a simple and straightforward algorithm, the value of each pixel p(i, j) is predicted to be the value of the immediately preceding pixel p(i−1, j). This predictor algorithm provides a computationally extremely efficient tool for the prediction of each pixel value, with the first pixel in the image being estimated at a value of zero. The difference value is then generated by finding the absolute value of the difference between the predicted value and the actual value for the pixel of interest. The resulting difference values form a matrix of equal size to the original image matrix.

Several alternative predictor algorithms are presently contemplated, and others may be employed as well. In the presently preferred embodiment, these predictor algorithms may be summarized as follows:

$$Ip(i,j)=Ip(i-1,j) \quad (P1);$$

$$Ip(i,j)=Ip(i-1,j)+Ip(i,j-1)-Ip(i-1,j-1) \quad (P2);$$

$$Ip(i,j)=((3*(Ip(i-1,j))+Ip(i-1,j-1)+Ip(i,j-1)+Ip(i+1,j-1))/6 \quad (P3);$$

$$Ip(i,j)=((-2*I(i-1,j-1))+(3*Ip(i,j-1))+(3*Ip(i-1,j)))/4 \quad (P4);$$

$$Ip(i,j)=((-5*I(i-1,j-1))+(7*Ip(i,j-1))+Ip(i+1,j-1)+(9*Ip(i-1,j)))/12 \quad (P5);$$

$$Ip(i,j)=Ip(i,j-1)+Ip(i-1,j))/2 \quad (P6);$$

where the notation "I" represents the pixel intensity, and the individual pixel designations are mapped in accordance with FIG. 5.

Again, it has been found that various predictors are particularly useful for various types of images, images resulting from various modalities, and various features or anatomies visible in the reconstructed image. For example, the predictor algorithm P1 provides an extremely simple and rapid "last value" estimate of each current pixel value. Predictor P2 provides some degree of edge detection capability, but may accentuate the influence of noise in the image. The third predictor value P3 is a linear predictor shown useful on certain image types and employs values for more of the surrounding pixels, weighting the last value more heavily. In practice, the predictor preferences generated at step 272 of FIG. 6 will follow empirical results for various image types and modalities.

The final step illustrated in segment 250 of the control logic of FIG. 6 is the generation of subregion preferences for the division of the image data stream into subregions. As indicated above, while the lengths of subregions of the image data stream may be different or may vary depending upon such factors as the entropy level, in the presently preferred configuration, the subregion lengths are set equal to one another, but may vary depending upon such factors as the modality originating the image data, the image type, anatomy illustrated in the reconstructed image, and so forth. For example, subregion lengths of 32 pixels are presently set to a default, but alternative subregion lengths of 8, 16, 24, or more than 32 pixels, are contemplated. In general, the preferences set at step 274 in the present embodiment are dependent upon the number of columns in the image matrix, with subregion lengths of 8 being used for matrices having 64 columns or less, subregion lengths of 16 being used for matrices having 128 columns or less, and so forth. To reduce the computational complexity and to improve speed, in the presently preferred embodiment, the subregions are taken along the major direction or axis (i.e. rows or columns) of the image matrix, depending upon the direction in which the data is stored. Also, the subregions are preferably one dimensional only.

With the compression algorithms, tables, predictor preferences, and subregion size preferences set, the control logic illustrated in FIG. 6 advances through segment 252. In that segment of the logic, the image data is received as indicated at step 276. As noted above, the image data may be directly received from an external source, or may be accessed from a memory within the PACS itself. At step 278, any descriptive information used to select algorithms or parameters of the compression routine are retrieved from the database server. As noted above, such descriptive information may be stored in databases, and may complement the information contained within the descriptive header of the image data stream.

Following segment 252, control advances to evaluation segment 254. Within this segment, the image data is reviewed for descriptive information as indicated at step 280. As described above, where descriptive information is available, such as DICOM compliant data in a descriptive header section of the image data stream or descriptive data from the database, some or all of this data is reviewed at step 280. Based upon the preferences set in the configuration segment 272, predictors are selected at step 282 depending upon the image characteristics identified at step 280. Again, these may include the modality of the originating imaging system, the study type or anatomy featured in the image, the number of columns in the image, the number of rows, and so forth. Moreover, other factors may be considered in selecting the predictors at step 282, such as the computational efficiency desired, the processing power of the system, and so forth, with computationally efficient predictors being selected where such processor capabilities are limited, or where additional speed is desired. At step 284, the subregion size for division of the image data stream into subregions is selected in accordance with the preferences established at step 274. Again, step 284 may consist of a default selection, which may be altered depending upon some or all of the characteristics or factors considered for selection of the predictors.

Evaluation segment 254 continues with the selection of a subset of compression tables, where appropriate, as indicated at step 286. In particular, based upon certain image characteristics, it may be useful to preselect certain compression tables as defaults. For example, specific image types originating in specific modalities, such as CT or MR images, may be best compressed with specific candidate tables that may be selected at step 286. At step 288 a compression header is affixed to the image data. As described below, this compression header will contain code identifying the version of the compression routine, the predictors selected at step 282, the subregion sizes selected at step 284, and so forth.

At compression segment 256 of the control logic, a set of prediction errors or difference values are computed at step 290. As noted above, these values are based upon application of one or more of the predictor algorithms selected at step 282, and by subsequently comparing the predicted values with the actual values for each pixel to determine the prediction error or difference. The resulting prediction errors then form a data stream with the first pixel being assigned its actual value, followed by the difference values for each pixel of the subregion.

The present technique provides for optimal compression of each of the subregions based upon appropriate selection of tables from the family of compression code tables established at step 270. To determine which tables provide best compression, at step 290 of the control logic of FIG. 6, candidate lengths of compressed data are computed by application of each of the candidate compression code tables to the data resulting from application of the predictor algorithms. The total data stream length for each subregion is summed for each case (i.e. application of each of the compression code tables). Following completion of each subregion, the resulting sums are compared to identify which compression code table results in the shortest data stream for the subregion. The corresponding compression code table is then selected as indicated at step 292. At step 294, code identifying the selected table for each subregion is then inserted into the compressed data and its header, as described in greater detail below.

As noted above, evaluation segment 254 or compression segment 256 may include defaults and constraints on the selection of the optimal code tables. For example, depending upon such factors as the bit depth of the image data to be encoded, certain default selections among the compression code tables may be made, such as selection of the first four tables for bit depths of 8 or less. In addition, certain preferences for designated compression code tables may be made in this selection process, depending upon such factors as the modality originating the image data. By way of example, CT and MRI data may tend to encode higher transitions of pixel intensities, corresponding to higher entropy regions. Accordingly, preferences may be included in the selection of the compression code tables, depending upon the descriptive data reviewed at step 280, such as to prefer one or more higher entropy tables for images originating in such modalities. Finally, in the presently preferred embodiment, code will be inserted directly into the compressed data stream to provide an indication of which of the selected tables is employed for compressing the individual subregions. To optimize the compression, it may be desirable to limit the number of tables which may be selected in the preprocess segment of the control logic to a number which may be conveniently coded in a limited number of bits, such as 2 bits of data. Thus, where table identification codes are to be provided in 2 bits, a constraint may be imposed in the preprocess segment such that only four of the candidate tables may be selected for the compression. Where an additional bit is available for identification of the tables, 8 candidate tables may be selected and encoded.

At step 294 key code for the subregion compression is inserted into the compressed data stream, immediately preceding the compressed subregion data. As noted above, where four candidate tables are employed for the compression, the code inserted at step 294 may include a pair of designated bits. The compression header created at step 288 cross references this key code to the selected compression tables. At step 296, the image data for the subregion is compressed by application of the selected compression code table. The series of steps of segment 256 is repeated for each subregion of the image until the entire image is compressed.

In final segment 258 the compressed data for each image is completed. Specifically, at step 298, a compression end block is added to the compressed data. At step 300, padding bits are inserted following the compression end block. Finally, at step 302 a checksum value computed through the compression process is added to the compressed data to provide a means for verifying proper decompression. The position and type of code added to the compressed data during segment 258 is described more fully below with reference to FIG. 13.

Where a descriptive header is provided for the original image data, the descriptive header is preferably replaced adjacent to the compression header to complete the image file as indicated at step 260. It will be noted that the resulting data file is a hybrid compressed data file in which the descriptive header data is readable for image management, access, transmission, and similar purposes, while the bulk of the image data is optimally compressed as described above. At step 262, the resulting file is saved, typically in a short term storage system, or in an archive. At step 264 the image is accessed for reviewing, analysis, hard copy creation, and so forth. Upon access of the image, the decompression algorithms identified in the hybrid compressed data file are retrieved for decompression, and the compressed image data is decompressed, as indicated at step 266. This decompression follows the compression header information, with the same compression code tables being employed to decompress the data as were employed to compress it for each subregion. This application of the compression code tables results in identification of the prediction errors or differences on which the compression was based, and the specific predictor algorithm or algorithms employed to generate the differences are then used to regenerate the original image data in a lossless fashion.

Figure 13:
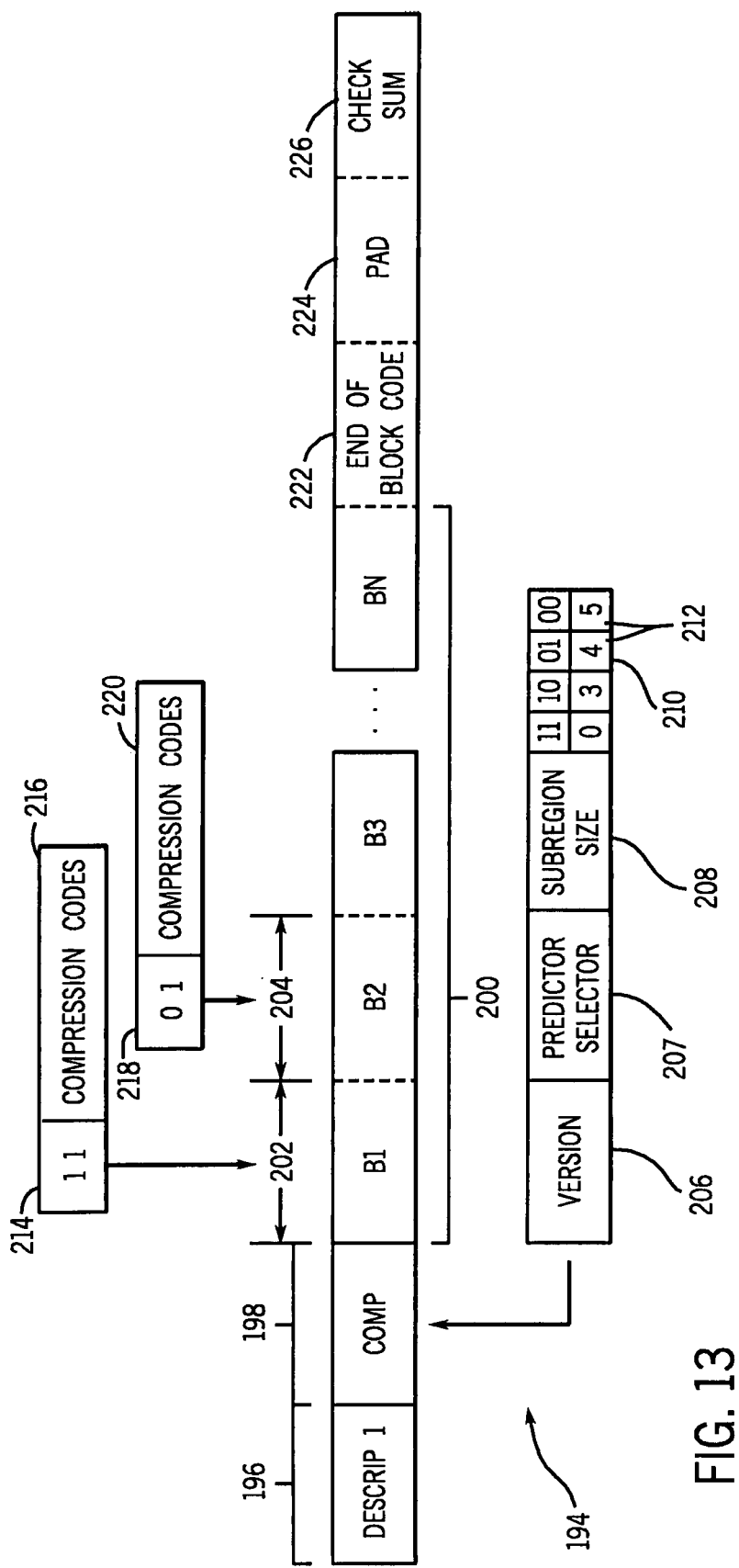
FIG. 13 is a diagrammatical representation of an exemplary image data set, including a descriptive header, a compression header, and blocks of compressed data by subregion.

FIG. 13 represents an image data set compressed in accordance with the foregoing technique. The image data set, designated generally by the reference numeral 194, includes the descriptive header 196 appended at step 160, along with the compression header 198 affixed at step 192. Following the compression header 198 is the compressed image data 200, which includes compressed image subregions 202, 204 and so forth. Each compressed data subregion, in turn, includes an identification of the algorithm or algorithms (e.g. compression code tables) used to encode the subregion, followed by the actual compressed data.

FIG. 13 also illustrates a presently contemplated format for a compression header 198. As shown in FIG. 13, the compression header includes an identification of the compression routine version 206, followed by an identification of the predictors used in the compression process 207, and identification of the subregion length at reference numeral 208. A compression algorithm identification segment 210 is then inserted in the compression header to identify which of the compression algorithms (e.g. compression code tables) were selected for the compression, and the manner in which each table is encoded in the data stream for each subregion. In the example of FIG. 13, for example, tables 0, 3, 4 and 5 were selected, as indicated at reference numeral 212, with each table being identified by a 2 bit binary code to be found within the first 2 bits of the compressed data for each subregion.

FIG. 13 also illustrates the format in the presently preferred embodiment for the compressed data code for each image subregion 202, 204, and so forth. In the illustrated embodiment, a first portion of each subregion includes an identification of the compression table used to compress the subregion data, as indicated at reference numeral 214 for subregion 202, and reference numeral 218 for subregion 204. This key code is followed by the compression codes as indicated at reference numerals 216 and 220, respectively. Finally, FIG. 13 illustrates the code inserted at the end of each compressed image file, or portion of a file. Specifically, following the last subregion BN of the image, the end of block code portion 222 is affixed. As noted above, this end of block code signals the end of an image, or may be used to signal the end of a portion of an image, where the data compression routine is changed within a single image, such as due to large variations in the image data entropy. The padding code is inserted as indicated at reference numeral 224. This code may be of variable size as needed to complete the compressed data file on a whole word length. Finally, a 32 bit checksum portion 226 is added to complete the compressed data.

The foregoing aspects of the present technique may be adapted in various manners depending upon the type of image to be compressed. For example, the technique may be used on both images composed of varying gray levels, as well as on color images. As will be appreciated by those skilled in the art, color images will typically consist of various color components, which produce the appearance of color variations due to their respective intensities. The foregoing technique may be used either with or without separating the color components from one another, but is preferably applied by separating the color components and processing (i.e. compressing) the components in groups. Similarly, multiframe images may be accommodated in the present technique. As will be appreciated by those skilled in the art, such images typically comprise a number of separate images encoded by rows and columns, without separate descriptive headers (e.g. DICOM compliant headers) positioned between the separate images. In such cases, code identifying offsets in the compressed data corresponding to locations of different image frames is preferably inserted into the descriptive header of the hybrid compressed data file.

It has been found that the foregoing image data compression and decompression technique can be further refined to provide for multiresolution (or multi-size) image data compression to further enhance rates of data transfer and decompression. Where a user does not desire to view a full image with maximum resolution, or where the user view port is limited, such multiresolution image compression facilitates transfer of a reduced size image to the user for viewing, with excellent image quality. Moreover, as described below, the multiresolution image compression aspect of the present technique allows a user to view a reduced size or reduced resolution image relatively rapidly, and to "zoom" on the image thereafter by transfer of only a portion of the compressed data corresponding to components of the greater sized image not already transferred. The additional data is then processed and combined with the reduced size image data to obtain the larger sized image.

The present multiresolution implementation is based upon lossless integer wavelet decomposition in combination with optimized Huffman code compression as described above, and modification of the Huffman code compression based on a recognition of the nature of high frequency data sets from the wavelet decomposition. Specifically, as will be recognized by those skilled in the art, wavelet decomposition involves a dyadic filtering and sub-sampling process. This creates a hierarchical set of sub-bands, as illustrated in FIG. 14. As illustrated in FIG. 14, an image data set 300 includes low frequency components 302 along with high frequency components 304, which may be considered as noise or variations from the low frequency components. A single level wavelet decomposition results in a decomposed data set 306 which includes one low frequency sub-band LL, designated by reference numeral 308 in FIG. 14, along with three high frequency ones LH, HL, and HH, designated by reference numerals 310, 312 and 314. Subsequent decomposition may be considered to produce a further data set 316 in which the low frequency sub-band is further decomposed into a set 318 of sub-bands, including a low frequency band 320, along with three additional high frequency sub-bands 322, 324 and 326.

Typically wavelet transforms are real (floating point) filters with the result also being real values. Until recently only the S-Transform (a modified Haar wavelet) provided an integer-based transformation and reconstruction. As evident from the nature of the transformation it is very difficult to preserve precision with floating point operations. However, by a technique referred to as "lifting," any wavelet transformation may be implemented as an integer-based transformation with full reversibility.

Using this "lifting" technique various wavelet transforms were analyzed and compared, including the S-Transform (Haar wavelet with lifting), a (2+2,2) transform, and a (4,2) transform. Moreover, analysis was done based on the information theoretic entropy values of the resulting sub-bands. Entropy values in base 2 provide the lower bounds on the average length of the variable length code (VLC) through Kraft's Inequality. In addition to the entropy values, the operations required to represent the values of a single entry in each of the four sub-bands were determined. The outcome of the analysis suggested that the optimum wavelet to use for the transformation is the S-Transform. Although other transforms may be employed, in the present embodiment, the S-Transform is preferred; with the emphasis being placed on the speed and complexity of the transformation more so than the resulting compression ratios.

For decomposition of the image data set, a forward one step wavelet transform in one dimension is based on the following equations:

$$L(n)=\lfloor (C(2n)+C(2n+1))/2 \rfloor \text{ for } n \epsilon [0,N/2-1]$$

and $$H(n)=C(2n)-C(2n+1);$$

where C(i) for $i \epsilon [0,N-1]$ represents the input data, L and H are the decomposed low and high frequency components, and C is the input data. The operation designed by the symbols "$\lfloor \rfloor$" produces the greatest integer less than the operands with "N" being the size of the input data.

The converse of this transformation, the one step inverse wavelet transform is described by the following equations:

$$C(2n)=L(n)+\lfloor (H(n)+1)/2 \rfloor$$

and $$C(2n+1)=C(2n)-H(n).$$

An implicit assumption in the foregoing equations is the fact that the data size "N" is even. Though valid for theoretical analysis and description, this assumption may not be valid for certain data sets to be compressed in the present technique. The technique has, however, been adapted to accommodate odd and even sizes of the input data, and to extend the one-dimensional transform to a two-dimensional one, as summarized below.

The equations for the forward and inverse wavelet transforms described above provide one-dimensional single-step transformation. Recursive single-step wavelet decompositions in two dimensions provide the tessellation of the image as depicted in FIG. 14. In the present technique, a recursion of a single-step wavelet transform is performed on the low frequency or "LL" component at every level. The number of levels for the transformation is determined by fixing the row and/or column size of the smallest resolution. This level value is determined by the steps necessary to decompose the maximum of the row or column size of the original image to the desired smallest resolution size. If "n" is this level variable then the following equation is used:

$$n=\log_2(\max(\text{rows},\text{cols}))-\log_2(d_{size})$$

where n is the number of levels of decomposition, "rows" and "cols" are the original image dimensions, $\log_2$ is the log in base 2, and $d_{size}$ is the configurable size of the smallest resolution image.

Special handling of the odd row or column at every level is performed. In a present implementation, the odd row or the odd column is replicated with the aim to force it to be even such that the algorithm for the wavelet transformation is a seamless unit. While this addition adds somewhat to the memory space needed for image storage, the additions are negligible when compression is performed because the high frequency sub-bands will have all zeros in those rows or columns.

Referring to the nomenclature employed above, the two-dimensional one-step forward transformation to decompose a quad o input image data (a, b, c, d) to ll, hl, lh, hh is governed by the following equations:

$$ll = \lfloor (\lfloor(a+b)/2\rfloor + \lfloor(c+d)/2\rfloor)/2 \rfloor;$$

$$hl = \lfloor ((a-b)+(c-d))/2 \rfloor;$$

$$lh = \lfloor(a+b)/2\rfloor - \lfloor(c+d)/2\rfloor; \text{ and}$$

$$hh = (a-b)-(c-d).$$

In addition to handling the odd row and odd column numbers at every level of the transform, the present technique has been adapted to accommodate the possibility of overflow when using signed or unsigned 16 bit arrays. While all values could be treated as 32 bit values, loss of speed in performing the desired transformations may result, as well as a significant increase in the memory required to process the image. In a present implementation designed for PACS, because a significant majority of the data values lie within 14 bits for unsigned and signed data, to preserve the speed of the algorithm and to create the minimum possible memory map, 16 bit signed and unsigned routines are employed as a default, while checking for overflow conditions, as described below. When an overflow condition is encountered, the 16 bit-based transform routine exits to the appropriate overflow routine.

FIG. 15 illustrates diagrammatically the progressive processing of image data by wavelet decomposition and Huffman code compression to produce a data stream for storage, access and transmission. The general process flow, designated generally by the reference numeral 328 in FIG. 15, begins with the image data set 330, which may be acquired in any suitable manner and which may be preprocessed, such as for dynamic range adjustment, image enhancement, and so forth. This image, designated as a level 0 in the example, is then decomposed by forward wavelet transformation as described above, to provide a data set 332, itself comprising LL, LH, HL and HH data sets. The low frequency data set may then be further decomposed by similar forward wavelet transformation to generate a next level data set 334. Further wavelet transformation on the low frequency data set at each successive level provides a similar data set, until a final data set 336 is reached, which is considered the smallest or lowest resolution data set desired, denoted "n" in the present example.

The data sets obtained by successive wavelet decomposition are then compressed as follows. At each level, the high frequency data sets are compressed in accordance with a modified compression routine, as designated by reference numeral 338. In this modified routine, all processing is substantially identical to that described above, with the exception that the actual values of the data sets are used rather than predicted error values. That is, steps 280-290 illustrated in FIG. 6 are not performed, while other steps, such as subregion analysis, optimum code table selection, and so forth, are performed in substantially the same manner. The modified compression routine performed on the high frequency wavelet transformed data sets is based upon a realization that the wavelet transformed data is already decorrelated in a manner that enables the present compression technique to be applied directly without the need to predict or compute error values.

Because the low frequency data sets for each higher level is further decomposed, information descriptive of these data sets is preserved in the lower levels, with the exception of the lower-most low frequency data set (i.e., the low frequency data set at the nth level). In the present implementation, this data set is compressed in accordance with the predictive error compression technique described above, as indicated by reference numeral 340 in FIG. 15.

Several points should be noted regarding the decomposition and compression summarized in FIG. 15. First, as will be appreciated by those skilled in the art, depending upon the size and type of data analyzed, the values in the Huffman code tables described above, the subregion lengths, and other specific parameters may be adapted to provide the desired compression ratios and speed of compression. Moreover, because successive decomposition of the low frequency data sets results in progressively smaller data sets (halved in both dimensions), these data sets offer the possibility of access, transmission and reconstruction at any of the available levels for the multiresolution compression and decompression aspect of the present technique.

Following compression of the high and low frequency data sets as summarized in FIG. 15, the resulting data is compiled in a data stream or file as indicated by reference numeral 342. In a present embodiment, the data stream includes a descriptive header 344, followed by a series of data sets, including a first set 346 for the lower-most resolution data (including the low and high frequency compressed data), and successive data sets 348, each including high frequency compressed data for the respective level. In a present implementation, the data stream or file includes a header describing the version of the multiresolution scheme, the type of forward transform (sign/unsigned with/without overflow, see the discussion below), the number of levels of wavelet decomposition, the row and column values of every sub-band level (resolution), and the compressed sizes of all the sub-bands from smallest to the largest. Again, the lowest level low frequency data set is compressed using predictive compression as described above, while the high frequency data sets for each level are compressed using the appropriate non-predictive or modified compression scheme. In addition to storing the data storage header at the top of the compressed stream, in a medical diagnostic context, other elements may be stored in a DICOM header. In a present implementation, these include the number of levels "n," row (rr) values (rr(n), rr(n−1), . . . , rr(0)), column (cc) values (cc(n), cc(n−1), . . . , cc(0)), and compressed data size (cxebyte) for every level (cxebyte(n), cxebyte(n−1), . . . , cxebyte(0)).

Figure 16:
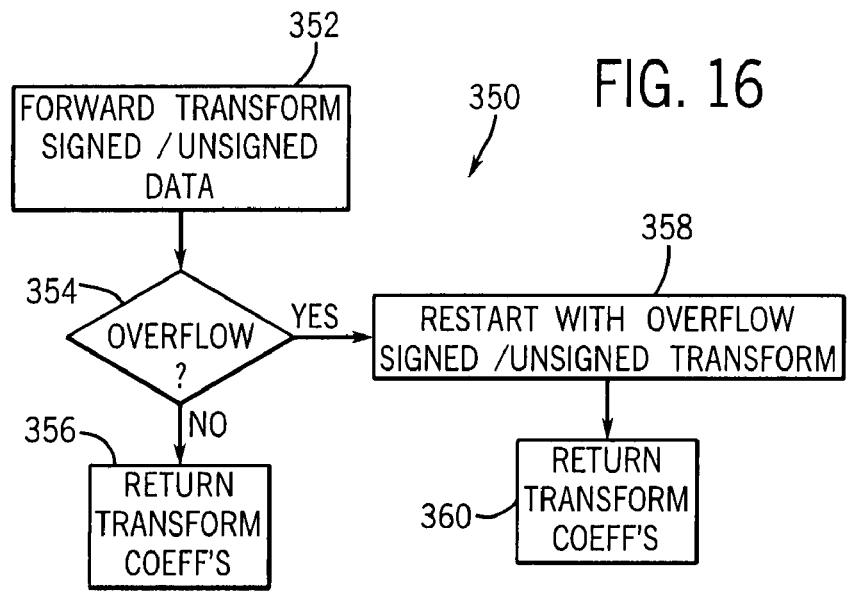
FIG. 16 is a flow chart illustrating exemplary logic in performing forward wavelet transformation in accordance with a present embodiment.

As noted above, in order to provide an efficient implementation from processing and storage standpoints, a present embodiment provides for 16 bit processing, with 32 bit processing only where required by the input data. Referring to FIG. 16, logic for wavelet transformation in accordance with this approach is summarized, as indicated by reference numeral 350. In this implementation, four forward transform routines were coded, one each for signed and unsigned 16 bit data and one each to handle the signed and unsigned overflow conditions (the overflow routines were 32 bit versions of their 16 bit counterparts). Thus, at step 352, a forward transform is performed on the signed and unsigned data. At step 354, the data is analyzed to determine whether overflow processing is needed. If not, the transform coefficients are returned, as noted at step 356, and processing continues as described above. If, however, 32 bit processing is needed, the logic diverts to step 358, where the transform is restarted with overflow, and the transform coefficients from such processing are then returned as noted at step 360. Similar techniques may apply for the processing of 8 bit and color data types.

Figure 17:
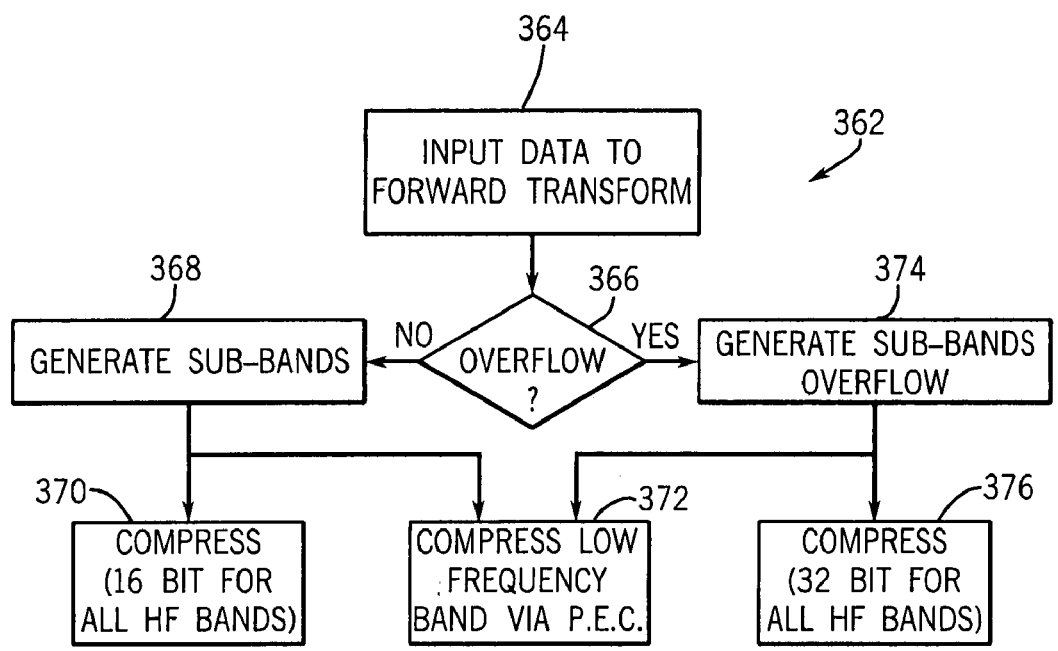
FIG. 17 is a flow chart illustrating exemplary logic in performing forward wavelet decomposition for multiresolution image data compression.

When combined with the compression used at the lowest or nth level of the wavelet decomposed data sets, the foregoing scheme may be summarized as illustrated in FIG. 17. The logic, referred to generally by reference numeral 362, begins at step 364, wherein the image data is input for forward transformation. Four routines were coded in a present implementation, corresponding to the four forward routines. At the reconstruction phase, described below, the encoded type flag signals the appropriate inverse transform routine to be used. This simplifies the reconstruction phase. The process flow summarized in FIG. 17 reflects the implementation in which, along with the non-predictive or modified compression scheme, processing has been adapted to handle the 32 bit signed and unsigned data that was generated by the respective overflow forward transformation routines. Thus, at step 366, it is determined whether overflow has occurred requiring 32 bit processing. If not, the sub-bands or data sets for the successive levels are generated at step 368, and the modified compression technique is carried out for all high frequency data sets of sub-bands, as indicated at step 370. As noted above, the lowest or nth level low frequency data set is compressed in accordance with the predictive compression technique. If, at step 366, it is determined that overflow processing is needed, the sub-bands or data sets are generated at step 374 and the high frequency data sets are compressed via 32 bit processing, as noted at step 376. Again, the low frequency data set for the nth level is compressed at step 372 in accordance with the predictive compression scenario. As noted above, the compression Huffman code tables used for the compression may be adapted in accordance with the exigencies of the data, such at to handle the resulting 18 bit signed and unsigned data. In a present implementation, additional code tables are employed for coding and decoding when the input exceeds 16 bits of storage. The overflow condition has a maximum bit depth of 18 bits signed.

A present implementation of the foregoing technique provides function calls to access all the values that are enumerated above. These elements are not required for the decompression and inverse transform routines as they are present in the header of the compressed stream. However, they are desirable where the user may wish to display images at different resolution levels. The decompression and reconstruction routines may be composed such that for all users no changes to the interface are needed, apart from buffering the reconstructed data. For users with specific needs to display at various resolution levels, user-specific routines may be developed.

A data stream or file map created by the foregoing technique is illustrated in somewhat greater detail in FIG. 18. As discussed above, the data stream or file 342 includes header 344, followed by code valves for the compressed sub-bands or data sets, beginning with the nth data set. Within these data segments, sections 378 encode the low and high frequency sub-bands or data sets. In the following data segments 348, sections 380 encode high frequency sub-bands or data sets for the higher levels. It should also be noted that, as mentioned above, additional code values are included within the data stream for the information discussed above with respect to Huffman code tables used for compression, subregion lengths, and so forth.

FIG. 19 summarizes diagrammatically the process for decompressing and reconstructing images from the compressed data file. The process, designated generally by reference numeral 382, includes accessing the data for the lowest level data sets and for any further data sets through the size or resolution to be provided to the user. Thus, as summarized in FIG. 19, the data from the file is accessed, in accordance with the information stored in the header, and decompressed, with the low frequency data set for the lowest level being decompressed, as indicated at reference numeral 384, in accordance with the predictive error technique discussed above. The high frequency sub-bands or data sets are decompressed, as indicated at reference numeral 386, in accordance with the modified compression technique. That is, rather than treating the decompressed data as predicted errors, the resulting data is treated as wavelet transform coefficients directly.

Following decompression of data up to the desired level, inverse wavelet transformation is performed on the decompressed data, with the lower level image data sets serving as the low frequency sub-band for the next higher image level. Thus, the inverse transform routine operates by treating the smallest resolution "LL" band and combining it with its associated "HL", "LH", and "HH" bands to produce the next higher resolution "LL" band. This process is repeated until either the full resolution of the image is achieved or a specified level of resolution is attained. The one step inverse transform takes the ll, hl, lh, and hh values, that is, the values for the lowest level, and produces the quad pixels for the next level ll band (at the final inverse transformation the full resolution pixel data for the image is produced).

Again, referring to the nomenclature employed above, the one-step two-dimensional inverse transform is governed by the following set of equations:

$$a = ll + \lfloor (hl+1)/2 \rfloor + \lfloor (lh + \lfloor (hh+1)/2 \rfloor) + 1)/2 \rfloor;$$

$$b = ll + \lfloor (hl+1)/2 \rfloor + \lfloor (lh + \lfloor (hh+1)/2 \rfloor) + 1)/2 \rfloor - (lh + \lfloor (hh+1)/2 \rfloor);$$

$$c = ll + \lfloor (hl+1)/2 \rfloor - hl + \lfloor (lh + \lfloor (hh+1)/2 \rfloor - hh+1)/2 \rfloor; \text{ and}$$

$$d = (ll + \lfloor (hl+1)/2 \rfloor - hl + \lfloor (lh + \lfloor (hh+1)/2 \rfloor - hh+1)/2 \rfloor) - (lh + \lfloor (hh+1)/2 \rfloor) - hh).$$

In a present implementation, the design for the inverse transform was made modular with respect to possible single level reconstruction. This allows users to specify a desired level, from the smallest resolution to full resolution, for reconstruction. Moreover, the encoding of the type of forward transform in the compressed data stream allows for the reconstruction using the correct inverse transform routine.

It should be noted that the foregoing technique permits access, transmission and reconstruction of images at any one of the stored sizes and resolutions. Moreover, where zooming or enhanced resolution is desired from an image already accessed by a user, only the additional high frequency bands for the higher resolution level need be accessed and processed for combination with the data already provided for reconstruction of the new image.

The multiresolution aspect of the technique thus provides targeted decompression and reconstruction for a specific level image between 0 and "n." The user provides the appropriate subset of the compressed stream from information present in the header, such as a DICOM header in a medical diagnostic application, with indication of the desired level of reconstruction to a level selection routine. A pixel buffer then allows the user to store the expanded and reconstructed image.

The foregoing novel functionality allows the user to efficiently use available transmission bandwidth. Exemplary compression results are summarized in table 388 of FIG. 20 for an image produced in a medical diagnostic context. In the example, a typical chest CR with image row size of 2048 and column size of 2500 is transformed to five levels. The relevant information of row and column sizes per level and the associated compressed bytes are shown. The 10 MB image is multiresolution compressed to a size of 3,909,848 bytes (the sum of the numbers of bytes listed for each image level in the table). Thus, to reconstruct the full resolution 2048×2500 image would require the transmission of approximately 3.9 MB of data.

The user may, however, access much smaller amounts of data as follows. By way of example, it is assumed that in a typical web-client application the resolution size of a user monitor is about 1 k×1 k. Reviewing the data set forth in table 388, this size limitation would approximately permit reconstruction to level 1. Thus, data required for transmission from the server equals 979,988 bytes (the sum of the bytes comprising the images through level 1. However, in many cases a subset of the full monitor resolution is allocated for the image display component. Consequently, in the example, a first image may be reconstructed to level 2 in a very rapid process, particularly as compared to transmission and reconstruction of the highest resolution image, requiring only 255,428 bytes to be transmitted. As the multi-resolution scheme allows for subsequent zooming to higher levels, then, the remaining 724,560 bytes to reconstruct level 1 from the level 2 image, and subsequently the remaining 2,929,860 bytes to reconstruct the full resolution image from a level 1 reconstructed image.

The foregoing techniques also may be used to transfer image data more efficiently by selectively transferring only those levels of the plurality of decomposition levels that are necessary for the desired display resolution at the client. Initially, the client retrieves one or more of the lower resolution levels, such as the lowest decomposition level N, for display of the image at the client. The remaining higher resolution levels, such as those between decomposition levels N−1 and 1, remain at the server for subsequent retrieval as needed by the client. Accordingly, if a user desires a higher resolution display of the image at the client, then the client retrieves one or more higher resolution levels from the server to support that higher resolution. The remaining resolution levels reside solely at the server until the user commands a local resolution display that requires those remaining levels.

Figure 21:
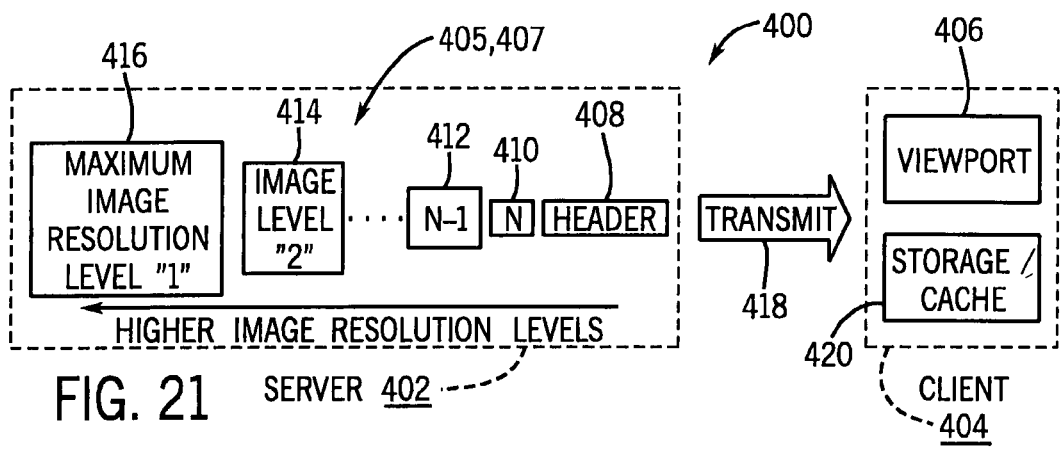
FIG. 21 is a diagram illustrating an exemplary image transmission system between a server and a client, which has a viewport for display of image data.

FIG. 21 illustrates an exemplary image transmission system 400, which comprises a server 402 and a client 404 remote from the server 402. A plurality of image data 405 is disposed on the server 402, which is accessible by the client 404 for retrieval of desired image resolution levels as needed for display of the image at a desired resolution on a viewport 406 of the client 404. The image data 405 may comprise a header 408 and a plurality of image data blocks, such as data blocks corresponding to image resolution levels, which have been generated by wavelet decomposition and have been compressed by any of the foregoing compression techniques. For example, the image data 405 may comprise image data blocks, such as image resolution levels 410, 412, 414, and 416, which correspond to progressively higher resolution levels from level N to level 1 (e.g., see FIGS. 15 and 18). One or more of these image resolution levels 410, 412, 414 and 416 may be transmitted, as indicated by arrow 418, based on the particular image resolution requested by the client 404 for display on the viewport 406. For example, the client 404 may desire display of a relatively low image resolution, which requires image levels 410 and 412. If these image levels 410 and 412 are not available locally at the client 404, then the client 404 may proceed to request the requisite image levels 410 and 412 from the server 402 by an automatic or manual request procedure, as described in detail below. As the client 404 retrieves image data from the server 402, the image data (i.e., image data for image levels 410 and 412) may be stored/cached by the client 404 in storage 420. If the client 404 subsequently desires a relatively higher image resolution (i.e., higher than the image levels 410 and 412), then the client 404 may request the requisite image levels from the server 402 and store those image levels in storage 420. As described in detail below, the image transmission system 400 determines the requisite number of image resolution levels for the desired resolution in the viewport 406 by comparing image resolutions of image levels 410 through 416 with the desired resolution of the viewport 406. The system 400 may obtain the resolution characteristics of the image levels 410 through 416 by reading the header 408 in an initial or subsequent retrieval of image data from the server 402

Figure 22:
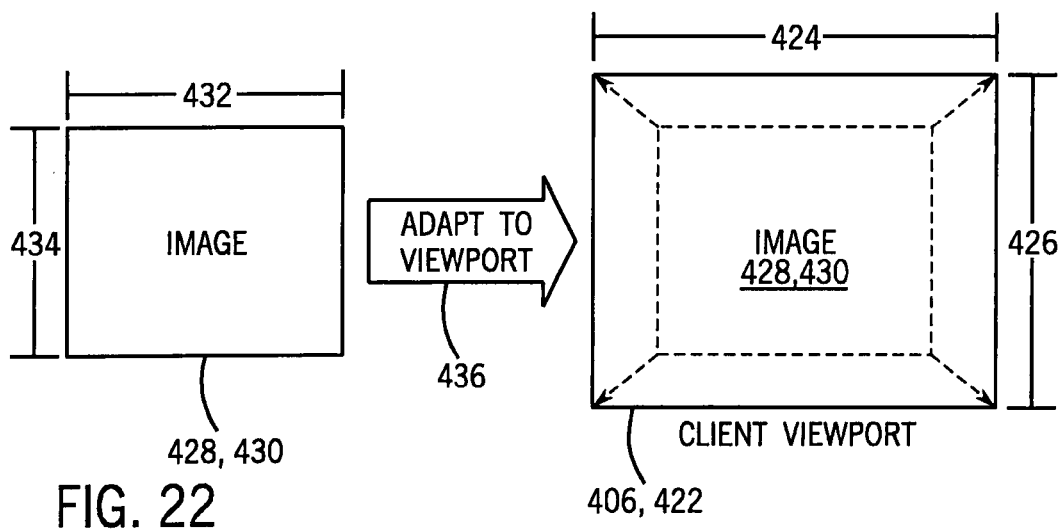
FIG. 22 is a diagram illustrating an exemplary upward scaling scheme for adapting an image resolution to fit the viewport.
Figure 23:
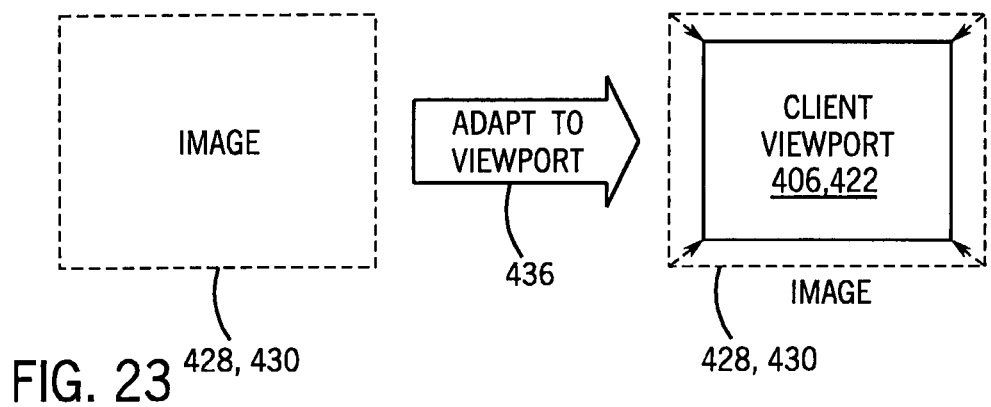
FIG. 23 is a diagram illustrating an exemplary downward scaling scheme for adapting the image resolution to fit the viewport.

As illustrated in FIGS. 22 and 23, the image levels 410 through 416 disposed on the server 402 may not have matching resolutions with the viewport 406. For example, the viewport 406 may have a viewport resolution 422, which has dimensions 424 and 426 (e.g., 256×256 pixels). As described in detail above, the present technique progressively recombines the image levels 410 through 416 to provide successively higher resolution displays of an image 428. At some point in this reconstruction process, one or more of the image levels 410 through 416 are combined to provide an image resolution 430, which has dimensions 432 and 434. As discussed in further detail below, the requisite image levels for the desired display resolution in the viewport 406 depend largely on the amount of resolution scaling that is required to adapt the image 428 to the client viewport 406. For example, image levels 410 and 412 may provide image resolutions of 140×140 pixels and 280×280 pixels, respectively.

The system 400 identifies the requisite image levels by comparing resolutions of the image 428 with the viewport 406, determining the requisite scaling for adapting the image 428 to the viewport 406, and by comparing the requisite scaling against a scaling threshold factor (ST). Any suitable scaling threshold factor (ST) may be used for the foregoing comparison, yet the ST factor may be used advantageously for maintaining an acceptable image quality for the desired application. Accordingly, an empirical scaling threshold factor (ST) of approximately 50% to 70% (e.g., 1.6 or 60% scaling) may particularly well suited for maintaining image quality. In operation, the system 400 may use the factor ST to determine that the relatively lower image resolution (i.e., image level 410) is adequate for display in the viewport 406. Accordingly, the client 404 proceeds to acquire the image level 410 from the server 402. The client 404 then reconstructs the image 428 and upwardly scales the reconstructed image 428 to fit the viewport 406. If the system 400 uses the factor ST to determine that the relatively higher image resolution (i.e. image level 412) is necessary for an acceptable display in the viewport 406, then the client 404 proceeds to acquire the image level 412. The client 404 then reconstructs the image 428 using the retrieved image level 412 and the image level 410, which was previously stored and display at the client 404. The reconstructed image 428 is then downwardly scaled to fit the viewport 406. The foregoing scaling threshold factor (ST) is discussed in further detail below with reference to FIGS. 24, 25 and 27.

As illustrated in FIG. 22, the image 428 is adapted to the viewport 406 by upwardly scaling the image resolution 430 to the viewport resolution 422 by a factor less than the scaling threshold factor (ST), which preserves the clarity of the image 428. Accordingly, the image transmission system 400 directs the client 404 to acquire only the image levels that have resolutions relatively lower than the viewport resolution 422. For example, if the image resolution 430 corresponds to the image level 412, then the client 404 acquires only the image levels up to and including the image level 412.

In contrast, as illustrated in FIG. 23, the image 428 is adapted to the viewport 406 by downwardly scaling the image resolution 430 to the viewport resolution 422 by a fractional scaling factor. In this scenario, the system 400 selected a relatively higher one of the image levels 410 through 416, because a relatively lower one required excessive scaling based on the scaling threshold factor (ST). For example, the image level 410 may require a scaling factor of 1.7 to adapt the image 428 to the viewport 406, while the image level 412 may require a scaling factor of 0.9 to adapt the image 428 to the viewport 406. If the scaling threshold factor (ST) is empirically set at 1.6, then the system 400 would identify the image level 412 as the acceptable image resolution level for reconstruction of the image 428 in the viewport 406 at the viewport resolution 422. Accordingly, the image transmission system 400 acquires the relatively higher image resolution level to ensure acceptable image clarity within the viewport 406.

Figure 24:
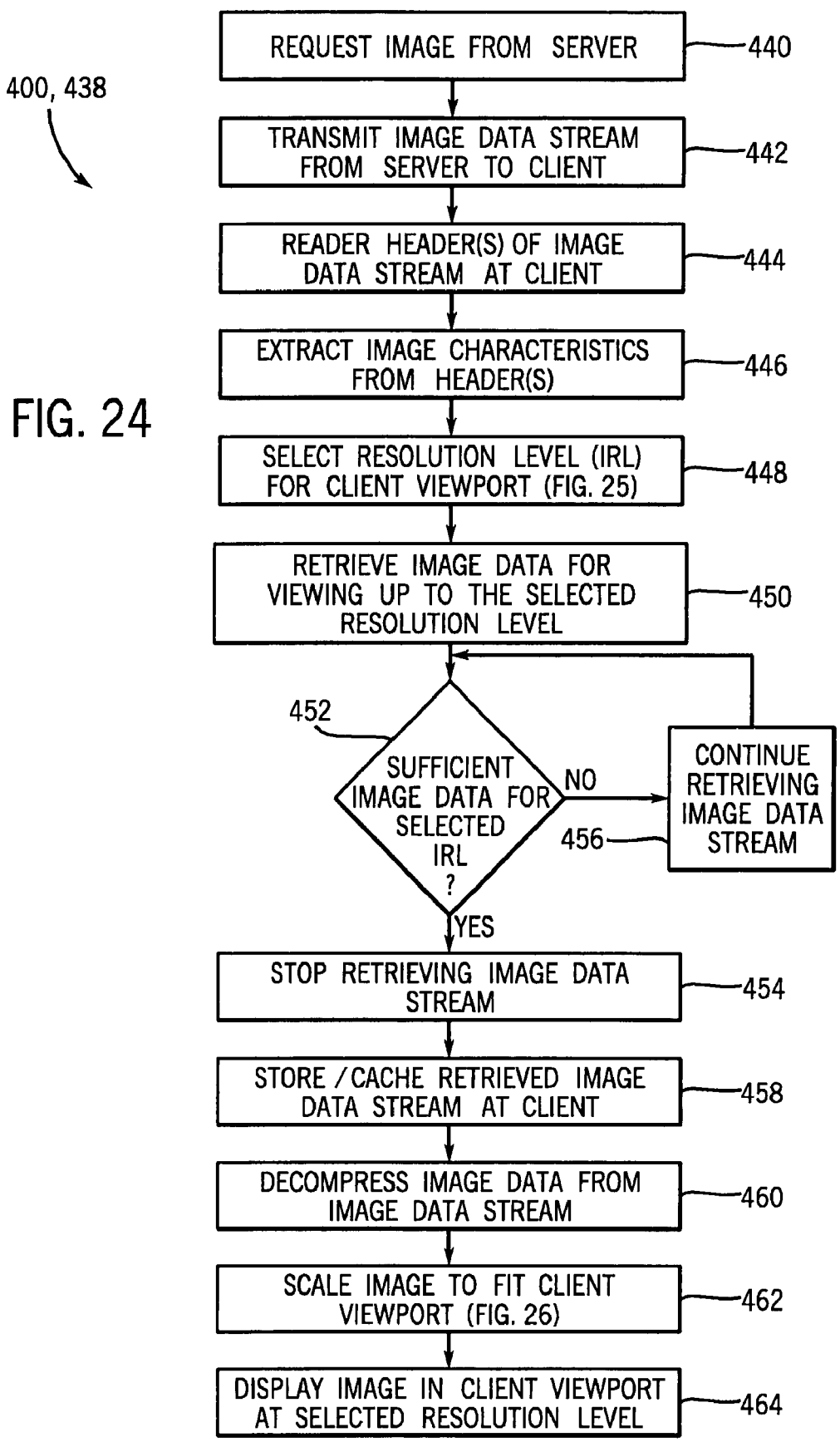
FIG. 24 is a flowchart illustrating an initial image retrieval and display process for the image transmission system illustrated in FIG. 21.

FIG. 24 is a flowchart illustrating an initial image retrieval and display process 438 for the image transmission system 400. As illustrated, the process 438 proceeds by requesting an image from the server (block 440), which then transmits an image data stream from the server to the client (block 442). The image data stream transmitted to the client is best illustrated in FIGS. 18 and 21. The client 404 then the reads the header 408 of the image data stream (block 444) and extracts image characteristics, such as image resolution characteristics of the image levels, from the header 408 (block 446).

As mentioned above and discussed in detail below, the process 438 then proceeds to select an image resolution level (IRL) for display in the client viewport 406 (block 448). The process 438 may select the image resolution level IRL simultaneously, or on-the-fly, as the client 404 retrieves the image data stream 407 from the server 402. Accordingly, the client 404 initially requests the entire set of image data 405, which is retrieved in order of increasingly higher image resolution levels for reconstruction of the image. The client 404 continues to retrieve the image data stream 407 up to the selected image resolution level IRL, which is adequate for viewing the image in the client viewport 406 (block 450). If the process 438 determines that a sufficient portion of the image data 405 has been retrieved for the selected resolution level IRL (block 452), then the process 438 stops retrieving the image data stream 407 (block 454). However, if an insufficient portion of the image data 405 has been retrieved for the selected resolution level IRL (block 452), then the process 438 continues retrieving the image data stream 407 until sufficient image resolution levels have been acquired for display at the selected resolution level IRL (block 456).

Figure 26:
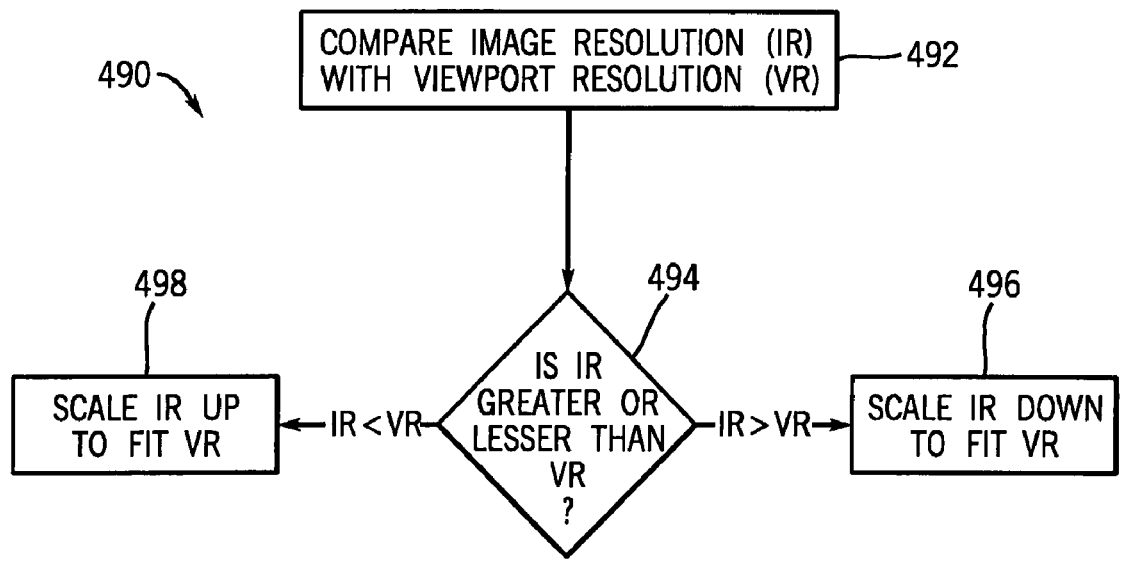
FIG. 26 is a flowchart illustrating exemplary scaling process for adapting the image resolution to fit the viewport, such as illustrated in FIGS. 22 and 23.

The retrieved image data stream is then stored/cached in storage 420 at the client 404 for local display of the image 428 (block 458). The image 428 is prepared for display in the viewport 406 by decompressing image data from the image data stream 407 (block 460), by reconstructing the image 428 from the image levels up to the retrieved resolution level IRL, and by scaling the image 428 to fit the client viewport 406 (block 462). FIG. 19 illustrates an exemplary image decompression technique, while FIGS. 22, 23 and 26 illustrate exemplary image scaling techniques. The image 428 is then displayed in the client viewport 406 at the selected resolution level IRL (block 464). As discussed above, the image resolution level (IRL) selected for initial display is the lowest image resolution level that does not require the image data to be scaled more than the scaling threshold factor (ST) for display in viewport 406.

Figure 25:
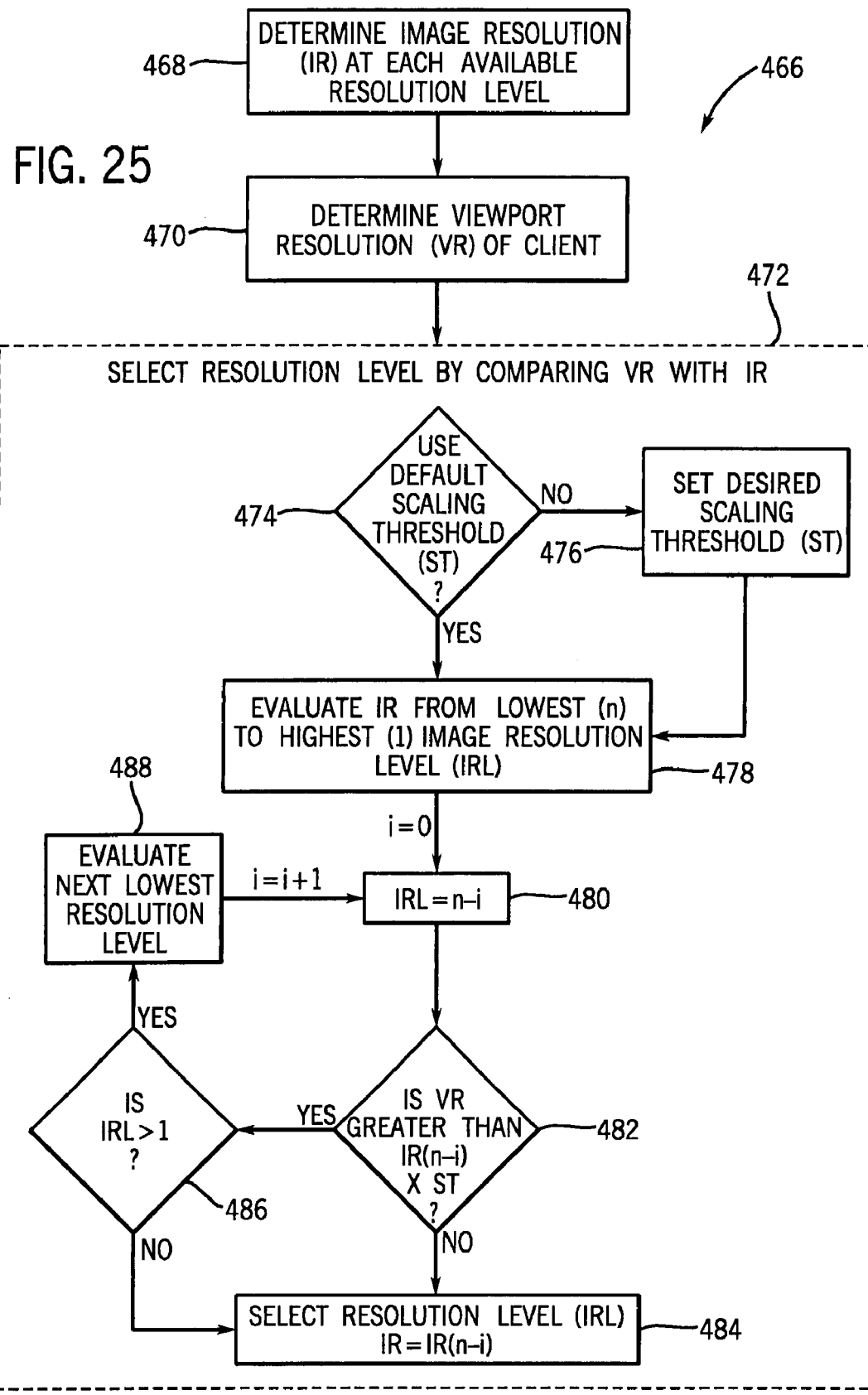
FIG. 25 is a flowchart illustrating an exemplary selection process for selecting an appropriate image resolution level for display in the viewport.

As discussed above, the present technique improves data transfer efficiency by transferring selective portions of the image data only as needed for display of the image 428 in the client viewport 406. Accordingly, the image data stream 407 being transferred from the server 402 to the client 404 is broken when sufficient image data has been retrieved for display at the desired viewport resolution 422 in the client viewport 406. FIG. 25 is a flowchart illustrating an exemplary selection process 466 for the image resolution level (IRL). As illustrated, the process 466 proceeds by determining the image resolution (IR) at each available resolution level stored on the server 402 (block 468) and by determining the viewport resolution 422 of the client viewport 406 (block 470). As discussed above, the process 466 can extract the image resolutions from the header 408 of the image data stream 407. The process 466 then proceeds to select a resolution level by comparing the viewport resolution 422 against progressively higher image resolutions (block 472).

This resolution selection block 472 may proceed by using a default scaling threshold factor (block 474) or by setting a desired scaling threshold factor (block 476). As described above, any suitable scaling threshold factor (ST) may be utilized by the process 466 to maintain acceptable image clarity and other image characteristics. Using the scaling threshold factor (ST), the resolution selection block 472 proceeds to evaluate the image resolution (IR) against the viewport resolution (VR). The process 466 analyzes each of the image resolution levels (IRL) stored on the server 402 until an acceptable resolution level is identified (block 478).

Accordingly, the resolution evaluation begins by analyzing the lowest image resolution (IRL at level N) at step I=0 (block 480). The image resolution is analyzed by determining whether the viewport resolution (VR) is greater than the image resolution (i.e., IR at level N) scaled by the scaling threshold (ST) to a value of IR(N−i) X ST (block 482). If the viewport resolution (VR) is not greater than the scaled image resolution IR(N−i) X ST, then the image resolution level N is adequate for display in the viewport 406. Accordingly, the resolution selection block 472 proceeds to select the image resolution level IRL, which corresponds to an image resolution of IR(N−i) (block 484). However, if the viewport resolution (VR) exceeds the scaled image resolution IR(N−i) X ST, then the resolution selection block 472 proceeds to determine whether additional higher image resolution levels are still available on the server 402 (block 486). If higher image resolution levels are not available (block 486), then the current resolution level is selected for display in the viewport 406 (block 484). If higher image resolution levels are available (block 486), then the resolution selection block 472 proceeds to evaluate the next lowest resolution level (i.e., level N−1) following the previously evaluated resolution level (i.e., level N) at step I=I+1 (block 488).

The resolution selection block 472 continues to loop through blocks 480, 482, 486 and 488 until the process 466 identifies an image resolution level (IRL) that is either high enough to satisfy the scaling threshold factor (ST) or embodies the maximum image resolution (IR) level 1. Once the process has identified and selected an adequately high image resolution level (IRL), the process 466 may proceed to use the selected resolution level (IRL) for selective retrieval of image levels up to and including the selected resolution level (IRL) from the server 402. In this exemplary embodiment, the image transmission system 400 uses the selected resolution level for both initial and subsequent retrieval and display of a desired image in the viewport 406.

As discussed above with reference to FIG. 24, the process 466 retrieves, stores and decompresses image data 405 in the image data stream 407 up to the selected resolution level (IRL). For optimal display of the image 428 in the viewport 406, the image 428 is scaled by a suitable factor to expand or contract the image 428 to the viewport 406. FIG. 26 is a flowchart of an exemplary scaling process 490, which compares the image resolution (i.e., the selected image resolution level) with the viewport resolution (VR) to determine the appropriate upward or downward scaling factor (block 492). If the image resolution is greater than the viewport resolution (block 494), then the scaling process 490 proceeds to scale the image resolution 430 downwardly to fit the viewport resolution (block 496). For example, the scaling process 490 may scale the image resolution 430 by a factor of 0.80 or 0.90 to fit the image 428 in the viewport 406. If the image resolution is less than the viewport resolution (block 494), then the scaling process 490 proceeds to scale the image resolution 430 upwardly to fit the viewport resolution (block 498). For example, the scaling process 490 may scale the image resolution 430 by a factor between 1.0 and 1.6. As discussed above, the scaling threshold factor (ST) forms the upper boundary for scaling. However, in some cases where the image 428 is relatively small or the viewport 406 is relatively large, the full image data set 405 may be necessary for an acceptable reconstruction of the image data 405 into the viewport 406. In this scenario, scaling is not limited to the scaling threshold (ST). The foregoing scaling process 490 may utilize any suitable scaling techniques, such as bicubic interpolation or bilinear interpolation.

As mentioned above, the image transmission system 400 can be utilized for continuous and automatic retrieval of image data as needed for display of the image 428 at the client 404. FIG. 27 is a flowchart illustrating an exemplary continuous data retrieval and display process 500, which the client 404 may trigger according to various display functions and commands. For example, the process 500 may retrieve additional image data automatically or interactively in response to a zooming command, which requires higher resolution image data than locally stored in the storage 420 at the client 404. In this exemplary embodiment, the process 500 retrieves additional image data automatically as needed for display in the viewport 406.

For example, the process 500 may acquire additional image data after the user zooms the image 428 in or out using the mouse (e.g., by holding the left mouse button down and expanding or contracting the viewport 406). Upon release of the mouse button, the process 500 may execute to determine whether additional image data is needed for display at the new viewport resolution. The user can also prevent automatic retrieval of the additional image data (i.e., progressively higher image resolution levels), such as by holding down the control key (i.e., "Ctrl" key) during interactive zooming of the image 428. This control key function provides the user the choice of either at retrieving additional image data to maintain image quality, or simply proceeding with the locally stored image data. During the foregoing interactive zooming operation, the process 500 may scale the image 428 to the viewport 406 by a relatively simple interpolation technique, such as bilinear interpolation, to improve the performance of the interactive zoom. However, the process 500 may use a more complex or more accurate interpolation technique, such as bicubic interpolation, to scale the image 428 after the interactive zooming is complete (i.e., after the user releases the mouse button).

Various other user commands are also within the scope of the present technique. For example, the process 500 may be triggered by a 1×, 2×, 3×, . . . 10× or higher resolution zoom command, a fit-to-view command, a full resolution and display command, a fit-to-view command, a mouse double-click to zoom in or out, a mouse selection of an area of interest (AOI), an image resolution level up or down command (e.g., to any one of the 1 to N image levels), a manual cine operation (e.g., roaming through a stack of images, such as the 1 to N image levels), or any other such zooming commands. In a manual cine operation, the present technique may employ a relatively simple interpolation technique and display the image 428 at a relatively lower image resolution level during operation to provide better performance while the user interactively browses the stack of images (e.g., by holding the mouse button down). However, upon selection of the desired image in the stack (e.g., release of the mouse button), the foregoing cine function may revert to the relatively more complex or accurate interpolation process and retrieve any additional image data that is needed for display of the selected image.

As illustrated in FIG. 27, the client 404 triggers the continuous retrieval and display process 500 by initiating a zoom to a desired viewport resolution (block 502). If the user initiates a "zoom out" operation (block 504), then the process 500 uses the highest stored resolution level (HSRL) in the client storage/cache (block 506). The highest stored resolution level (HSRL) may be used for optimal image display, because additional image resolution levels are not necessary and the highest stored resolution level provides the optimal image resolution for local display on the viewport 406. However, the process 500 may utilize a lower resolution level to improve performance. The process 500 then proceeds to scale the highest stored resolution level (HSRL) to the desired viewport resolution (block 508). In this exemplary embodiment, the process 500 continues to use the highest retrieved and stored image resolution level (HSRL) by default regardless of the upward or downward scaling of the image 428. For example, if the user double clicks the image 428 to obtain a full resolution display of the image 428, then any additional image data that is acquired for the full resolution display is still used after the user double clicks the image 428 back to its previous size.

If the user initiates a "zoom in" operation (block 504), then the continuous retrieval and display process 500 proceeds to determine the image resolution (IR) of the highest stored resolution level (HSRL) in the client storage/cache (block 510). As discussed above, the user may have the option (block 512) to proceed with a default scaling threshold (ST) or to set a desired scaling threshold (block 514). In either case, the process 500 utilizes the scaling threshold and factor (ST) to maintain acceptable clarity and characteristics of the image 428. Using the selected scaling threshold (ST), the process 500 proceeds to select a suitable image resolution (IR) for the viewport resolution (VR). Accordingly, the process 500 evaluates the highest stored resolution level (HSRL) at the client 404 and each progressively higher image resolution levels (IRL) at the server for 402 until the scaling threshold factor (ST) is satisfied (block 516).

In a step I=0, the process 500 proceeds to evaluate the highest stored resolution level (HSRL) at block 518. The image resolution is analyzed by determining whether the viewport resolution (VR) is greater than the image resolution (i.e., IR at level HSRL) scaled by the scaling threshold (ST) to a value of IR(HSRL) X ST (block 520). If the viewport resolution (VR) is not greater than the scaled image resolution IR(HSRL) X ST, then the image resolution level HSRL is adequate for display in the viewport 406. Accordingly, the process 500 proceeds to select the image resolution level (IRL), which corresponds to an image resolution of IR(HSRL) (block 522). However, if the viewport resolution (VR) exceeds the scaled image resolution IR(HSRL) X ST, then the process 500 proceeds to determine whether additional higher image resolution levels are still available on the server 402 (block 524). If higher image resolution levels are not available (block 524), then the current resolution level (i.e., HSRL) is selected for display in the viewport 406 (block 522). If higher image resolution levels are available (block 524), then process 500 proceeds to retrieve the next higher image resolution level (i.e., IRL=HSRL−1) from the server 402 (block 526). The retrieved higher image resolution level (IRL) is then stored/cached at the client 404 (block 528), where the retrieved IRL is integrated with the existing image data stored/cached at the client 404 (block 530). For example, any higher image resolution levels (IRLs) retrieved from the server 402 are appended to the compressed image data stream 407, as illustrated in FIG. 18.

The process 500 then proceeds to evaluate the next higher image resolution level (block 532), which is defined as IRL=HSRL−1 for this second evaluation loop I=I+1. As discussed above, the process 500 compares the viewport resolution (VR) against the image resolution (IR), which is now one resolution level higher at image level HSRL−1 (block 520). If the scaled image resolution IR(HSRL−1) X ST exceeds the viewport resolution (VR), then the process 500 selects the image resolution level HSRL−1 for display in the viewport 406 (block 522). If the viewport resolution (VR) exceeds the scaled image resolution IR(HSRL−1) X ST, then the process 500 proceeds to determine whether additional higher image resolution levels are still available on the server 402 (block 524). If higher image resolution levels are not available (block 524), then the process 500 selects the current resolution level (i.e., the highest stored resolution level) for display in the viewport 406 (block 522). Otherwise, the process 500 proceeds to retrieve the next higher image resolution level (i.e., IRL=HSRL−2) from the server 402 (block 526). The process 500 then stores/caches the retrieved IRL at the client 404 (block 528) and integrates the retrieved/stored IRL with existing image data stored/cached at the client 404 (block 530).

The process 500 continues to loop through blocks 518, 520, 524, 526, 528, 530 and 532 until the process 500 identifies an image resolution level (IRL) that is either high enough to satisfy the scaling threshold (ST) or embodies the maximum image resolution level (IRL=0). Once the process 500 has identified and selected an adequately high image resolution level (block 522), then the selected resolution level (IRL) may be decompressed (block 534), scaled to fit the client viewport 406 (block 536), and displayed in the client viewport 406 in the selected and scaled resolution level (block 538).

The present technique also may display a variety of image resolution and decompression level characteristics of the image 428. For example, the system may provide a textual block indicating the current image resolution or resolution level versus the maximum image resolution or total resolution levels. For example, the textual block may be formatted as IR/N, where IR is the current resolution level and N is total resolution levels for the image 428. If the system displays the maximum resolution of the image 428 in the viewport 406, then the textual block may read "FULL" or "FULLRES" to indicate that all available image data has been acquired and is being used for the image 428 being displayed in the viewport 406. The "FULL" resolution indicator may be used to indicate full resolution of the image 428, where the image data has been subject to the foregoing image decomposition and processing techniques. In contrast, the "FULLRES" resolution indicator may be used to indicate full resolution of the image 428, where the image data has not been subject to any of the foregoing decomposition and decompression techniques.

In addition, the textual block may indicate scaling/zooming characteristics of the image 428. For example, the textual block may display the scaling/zooming characteristics in the format "ZF: x.x," where x.x is a zoom factor for the presently displayed image 428. The zoom factor informs the user of the current scaling status of the image 428, which may have been scaled up or down in various degrees to fit the viewport 406. Accordingly, the user may hypothesize that the relative accuracy of the displayed image, depending on how much the image has been expanded beyond its actual resolution. The textual block also may display the type of interpolation, such as bilinear or bicubic interpolation, which is used for scaling the image 428.

An image information window also may be provided to display information from the header 408. The header information may include the total number of resolution levels (i.e., 1 through N), the rows and columns for each resolution level, and the memory size (e.g., bytes) of each compressed resolution level. The header information also may comprise various patient information, medical imaging system data, or any other desired information from one or more headers 408 in the image data stream 407.

The present technique also may provide a shortcut for acquiring the entire image data set from the server 402 and for displaying the acquired image 428 in the viewport 406 in full resolution (i.e., 1× zoom). This guarantees that the user has the full data set in a one-to-one relationship between the image pixels and the viewport pixels. As described above, various other zooming/scaling shortcuts may be provided to expedite image retrieval, scaling and display in the viewport 406.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for selectively transferring image data, the method comprising:
    selecting an image resolution suitable for display in a desired viewport from a plurality of different image resolutions, wherein the image resolution corresponds to one set of a plurality of data sets decomposed from an image by wavelet decomposition, and wherein the image resolution is determined via an iterative process that comprises determining whether scaling of one of the different image resolutions of the plurality of different image resolutions by a predetermined scaling threshold would result in a scaled image resolution that is less than or equal to the resolution of the desired viewport; and
    selectively requesting a portion of the plurality of data sets for recomposition of the image at the image resolution.

2. The method of claim 1, wherein the plurality of data sets forms at least part of an image data file that is wavelet decomposed and stored in a compressed form on a server.

3. The method of claim 2, wherein the image data file is wavelet decomposed and stored in a losslessly compressed form on the server.

4. The method of claim 3, wherein the image data file is wavelet decomposed in a lossless manner.

5. The method of claim 2, wherein the image data file is wavelet decomposed and stored in the compressed form on the server independent of any request from a client for data of the plurality of data sets.

6. The method of claim 1, wherein the wavelet decomposition comprises lossless wavelet decomposition.

7. The method of claim 6, wherein the lossless wavelet decomposition comprises lossless integer wavelet decomposition.

8. The method of claim 1, wherein the portion of the plurality of data sets is smaller than the plurality of data sets, and selectively requesting the portion comprises requesting a data stream comprising the plurality of data sets arranged sequentially in a desired order based upon the wavelet decomposition.

9. The method of claim 1, wherein selecting the image resolution comprises selecting the image resolution from a plurality of progressively higher resolution levels, each corresponding to one of the plurality of data sets.

10. The method of claim 9, wherein selecting the image resolution comprises identifying a lowest suitable one of the plurality of progressively higher resolution levels that does not require upward scaling beyond the scaling threshold for display in the desired viewport.

11. The method of claim 10, wherein identifying the lowest suitable one comprises evaluating a highest local resolution level of the plurality of progressively higher resolution levels.

12. The method of claim 11, wherein selectively requesting the portion comprises recalling the highest local resolution level, which is the lowest suitable one.

13. The method of claim 11, wherein selectively requesting the portion comprises remotely retrieving the lowest suitable one, and any resolution levels between the highest local resolution level and the lowest suitable one, from remote storage.

14. The method of claim 1, wherein selecting the image resolution comprises zooming the desired viewport toward a desired viewport resolution.

15. A method for selectively transferring image data, the method comprising:
determining a viewport resolution of a client viewport;
identifying a highest local resolution level corresponding to one local set of a plurality of decomposed image sets generated from an image by wavelet decomposition;
selecting an acceptable image resolution for display in the client viewport by comparing the viewport resolution against progressively higher resolution levels corresponding to the plurality of decomposed image sets, wherein the acceptable image resolution is selected via an iterative process that comprises determining whether scaling of one of the progressively higher resolution levels by a predetermined scaling threshold would result in a scaled image resolution that is less than or equal to the viewport resolution; and
remotely retrieving desired sets of the plurality of decomposed image sets for recomposing the image at the acceptable image resolution.

16. The method of claim 15, wherein selecting the acceptable image resolution comprises identifying a lowest suitable one of the progressively higher resolution levels that does not require upward scaling beyond the scaling threshold for display in the desired viewport.

17. The method of claim 16, wherein remotely retrieving desired sets comprises locally accessing the highest local resolution level if the lowest suitable one is less than or equal to the highest local resolution level.

18. The method of claim 16, wherein remotely retrieving desired sets comprises remotely retrieving the lowest suitable one and any intermediate sets having resolution levels between the highest local resolution level and the lowest suitable one.

19. The method of claim 15, wherein selecting the acceptable image resolution comprises selecting the highest local resolution level as the acceptable image resolution if the highest local resolution level does not require unacceptable scaling to equal the viewport resolution.

20. The method of claim 15, wherein remotely retrieving the desired sets comprises requesting a data stream comprising the desired sets of the plurality of decomposed image sets arranged sequentially in order of increasing resolution.

21. The method of claim 20, wherein the acts of determining the viewport resolution, identifying the highest local resolution level, selecting the acceptable image resolution, and remotely retrieving desired sets are executed automatically as a user interacts with the client viewport.

22. A system comprising:
a viewport analysis module configured for determining a viewport resolution of a client viewport;
a data selection module, comprising:
a local data identifier configured for identifying a highest local resolution level corresponding to one local set of a plurality of decomposed image sets generated from an image by wavelet decomposition; and
a desired data identifier configured for identifying an acceptable image resolution for display in the client viewport via an iterative process that comprises determining whether scaling of one resolution level corresponding to one decomposed image set of the plurality of decomposed image sets by a predetermined scaling threshold would result in a scaled image resolution that is less than or equal to the viewport resolution; and
a data retrieval module configured for remotely retrieving desired sets of the plurality of decomposed image sets for recomposing the image at the acceptable image resolution.

23. The system of claim 22, wherein the desired data identifier comprises a resolution comparator configured for comparing the viewport resolution against progressively higher resolution levels corresponding to the plurality of decomposed image sets.

24. The system of claim 23, wherein the resolution comparator comprises a minimum acceptable resolution identifier configured for identifying a lowest suitable one of the progressively higher resolution levels that does not require upward scaling beyond the scaling threshold for display in the client viewport.

25. The system of claim 24, wherein the data retrieval module comprises a local data access module configured for locally accessing the highest local resolution level if the lowest suitable one is less than or equal to the highest local resolution level.

26. The system of claim 24, wherein the desired data identifier is configured to identify a desired data group comprising the lowest suitable one and any intermediate sets having resolution levels between the highest local resolution level and the lowest suitable one.

27. A device comprising:
a computer-readable medium;
a computer program stored on the computer-readable medium, the computer program comprising:
a viewport analysis module stored on the computer-readable medium and configured for determining a viewport resolution of a client viewport; and a data selection module stored on the computer-readable medium, the data selection module comprising:
- a local data identifier configured for identifying a highest local resolution level corresponding to one local set of a plurality of decomposed image sets generated from an image by wavelet decomposition; and
- a desired data identifier configured for identifying an acceptable image resolution for display in the client viewport via an iterative process that comprises determining whether scaling of one resolution level corresponding to one decomposed image set of the plurality of decomposed image sets by a predetermined scaling threshold would result in a scaled image resolution that is less than or equal to the viewport resolution.

28. The device of claim 27, wherein the desired data identifier comprises a resolution comparator configured for comparing the viewport resolution against progressively higher resolution levels corresponding to the plurality of decomposed image sets.

29. The device of claim 28, wherein the resolution comparator comprises a minimum acceptable resolution identifier configured for identifying a lowest suitable one of the progressively higher resolution levels that does not require upward scaling beyond the scaling threshold for display in the client viewport.

* * * * *